United States Patent
Yang et al.

(10) Patent No.: US 11,107,822 B2
(45) Date of Patent: Aug. 31, 2021

(54) SEMICONDUCTOR DEVICE

(71) Applicant: Samsung Electronics Co., Ltd., Suwon-si (KR)

(72) Inventors: Jung Gil Yang, Suwon-si (KR); Sun Wook Kim, Suwon-si (KR); Jun Beom Park, Suwon-si (KR); Tae Young Kim, Suwon-si (KR); Geum Jong Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 30 days.

(21) Appl. No.: 16/722,081

(22) Filed: Dec. 20, 2019

(65) Prior Publication Data

US 2020/0365602 A1    Nov. 19, 2020

(30) Foreign Application Priority Data

May 17, 2019  (KR) .......................... 10-2019-0057758

(51) Int. Cl.
| | | |
|---|---|---|
| *H01L 27/11* | (2006.01) | |
| *H01L 23/528* | (2006.01) | |
| *H01L 29/06* | (2006.01) | |
| *H01L 29/775* | (2006.01) | |
| *H01L 27/02* | (2006.01) | |
| *H01L 29/423* | (2006.01) | |
| *H01L 29/78* | (2006.01) | |

(52) U.S. Cl.
CPC ........ *H01L 27/1108* (2013.01); *H01L 23/528* (2013.01)

(58) Field of Classification Search
CPC .......................... H01L 23/528; H01L 27/1108
See application file for complete search history.

(56) References Cited

U.S. PATENT DOCUMENTS

| | | | |
|---|---|---|---|
| 7,402,483 B2 | 7/2008 | Yun et al. | |
| 9,397,179 B1 | 7/2016 | Seo | |
| 9,425,291 B1* | 8/2016 | Balakrishnan | ...... H01L 27/0886 |
| 9,536,885 B2 | 1/2017 | Chang et al. | |
| 10,170,485 B2 | 1/2019 | Guillorn et al. | |
| 10,192,867 B1 | 1/2019 | Frougier et al. | |
| 2018/0174953 A1* | 6/2018 | Nam | ....................... H01L 23/48 |
| 2018/0181679 A1* | 6/2018 | Hong | ................ G06F 16/90339 |

FOREIGN PATENT DOCUMENTS

JP          5905630 B1          3/2016

* cited by examiner

*Primary Examiner* — Herve-Louis Y Assouman
(74) *Attorney, Agent, or Firm* — Muir Patent Law, PLLC

(57) ABSTRACT

A semiconductor device includes first and second fin type patterns, first and second gate patterns intersecting the first and second fin type patterns, third and fourth gate patterns intersecting the first fin type pattern between the first and the second gate patterns, a fifth gate pattern intersecting the second fin type pattern, a sixth gate pattern intersecting the second fin type pattern, first to third semiconductor patterns disposed among the first, the third, the fourth and the second gate patterns, and fourth to sixth semiconductor patterns disposed among the first, the fifth, the sixth and the second gate patterns. The first semiconductor pattern to the fourth semiconductor pattern and the sixth semiconductor pattern are electrically connected to a wiring structure, and the fifth semiconductor pattern is not connected to the wiring structure.

20 Claims, 25 Drawing Sheets

SEMICONDUCTOR DEVICE

CROSS-REFERENCE TO RELATED APPLICATION

This application claims priority under 35 U.S.C. § 119 to Korean Patent Application No. 10-2019-0057758 filed on May 17, 2019, in the Korean Intellectual Property Office, the disclosure of which is incorporated by reference herein in its entirety.

BACKGROUND

1. Technical Field

The present inventive concept relates to a semiconductor device, and more particularly, to a semiconductor device having a gate-all-around structure.

2. Description of the Related Art

To scale down semiconductor devices, a gate-all-around structure in which a silicon body in the form of a nanowire is formed on a substrate and a gate is formed to surround the silicon body has been proposed.

With a three-dimensional channel of the gate-all-around structure, the semiconductor devices may be scaled down. Also, even without increasing a gate length, a current control capability may be increased. Furthermore, it is possible to effectively suppress a short channel effect (SCE) in which a potential of a channel region is affected by a drain voltage.

SUMMARY

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an exemplary embodiment of the present inventive concept, a semiconductor device includes a first fin type pattern extending lengthwise in a first direction, a second fin type pattern extending lengthwise in the first direction and spaced apart from the first fin type pattern in a second direction different from the first direction, a first gate pattern and a second gate pattern intersecting the first fin type pattern and the second fin type pattern, a third gate pattern and a fourth gate pattern intersecting the first fin type pattern between the first gate pattern and the second gate pattern, a fifth gate pattern intersecting the second fin type pattern and spaced apart from the third gate pattern in the second direction, a sixth gate pattern intersecting the second fin type pattern and spaced apart from the fourth gate pattern in the second direction, first to third semiconductor patterns sequentially disposed on the first fin type pattern and disposed between the first gate pattern and the third gate pattern, between the third gate pattern and the fourth gate pattern, and between the fourth gate pattern and the second gate pattern respectively, and fourth to sixth semiconductor patterns sequentially disposed on the second fin type pattern and disposed between the first gate pattern and the fifth gate pattern, between the fifth gate pattern and the sixth gate pattern, and between the sixth gate pattern and the second gate pattern respectively. The first semiconductor pattern to the fourth semiconductor pattern and the sixth semiconductor pattern are electrically connected to a wiring structure, and the fifth semiconductor pattern is not connected to the wiring structure.

According to an exemplary embodiment of the present inventive concept, a semiconductor device includes a first fin type pattern which extends lengthwise in a first direction and has a first width in a second direction different from the first direction, in a first SRAM region, a second fin type pattern which extends lengthwise in the first direction and is spaced apart from the first fin type pattern in the second direction, in the first SRAM region, first to fourth gate patterns which intersect the first fin type pattern and are disposed sequentially in the first direction, each of the first gate pattern and the fourth gate pattern further intersecting the second fin type pattern, a first semiconductor pattern disposed on the first fin type pattern and between the second gate pattern and the third gate pattern, a second semiconductor pattern disposed on the second fin type pattern, the second semiconductor pattern and the first semiconductor pattern being arranged spaced apart from each other in the second direction, a third fin type pattern which extends lengthwise in a third direction and has a second width in a fourth direction different from the third direction, in a second SRAM region, fourth and fifth fin type patterns which extend lengthwise in the third direction in the second SRAM region and are spaced apart from the third fin type pattern in the fourth direction, the fourth and fifth fin type patterns being arranged in the third direction, fifth to eighth gate patterns which intersect the third fin type pattern and are sequentially arranged in the third direction, the fifth gate pattern further intersecting the fourth fin type pattern, and the eighth gate pattern further intersecting the fifth fin type pattern, a third semiconductor pattern disposed on the third fin type pattern and between the sixth gate pattern and the seventh gate pattern and a field insulating film disposed between a short side of the fourth fin type pattern and a short side of the fifth fin type pattern. The third semiconductor pattern and the field insulating film are arranged in the fourth direction.

According to an exemplary embodiment of the present inventive concept, a semiconductor device includes a first fin type pattern disposed in an SRAM region, a plurality of first semiconductor patterns disposed on the first fin type pattern to be spaced apart from each other in a first direction, at least one or more nanosheets disposed between corresponding two adjacent first semiconductor patterns of the plurality of first semiconductor patterns, and a plurality of second semiconductor patterns disposed on the first fin type pattern. The plurality of the first semiconductor patterns are electrically connected to a wiring structure. Each of the plurality of second semiconductor patterns is configured to be electrically in a floating state.

According to an exemplary embodiment of the present inventive concept, a semiconductor device includes a substrate including a logic region and an SRAM region defined by a deep trench, a first fin type pattern including a first short side, a second short side and a long side extending in a first direction and connecting the first short side and the second short side, and the first and the second short sides extending in a second direction different from the first direction, in a PMOS region of the SRAM region of the substrate, and a plurality of second fin type patterns each of which including a long side extending in a third direction and a short side extending in a fourth direction different from the third direction, in a PMOS region of the logic region of the substrate, at least one or more first nanosheets disposed on the first fin type pattern, and at least one or more second nanosheets disposed on each of the plurality of second fin type patterns. The first and the second short sides of the first fin type pattern are defined by the deep trench, and the long side of the first fin type pattern is defined by a first shallow trench of which a depth being smaller than a depth of the deep trench. The long side of each of the plurality of second fin type patterns is defined by a second shallow trench of which a depth being smaller than the depth of the deep trench, and the plurality of second fin type patterns are separated from each other in the third direction by a third shallow trench of which a depth being smaller than the depth of the deep trench.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF EXEMPLARY EMBODIMENTS

In the disclosure of a semiconductor device according to some embodiments of the present inventive concept, a gate-all-around transistor (GAA FET) including a channel region in the form of nanowire or nanosheet is presented, but the present inventive concept is not limited thereto. The semiconductor device according to some embodiments of the present inventive concept may, of course, include a tunneling transistor (tunneling FET), a transistor using a fin type pattern as a channel, or a three-dimensional (3D) transistor.

Figure 1:
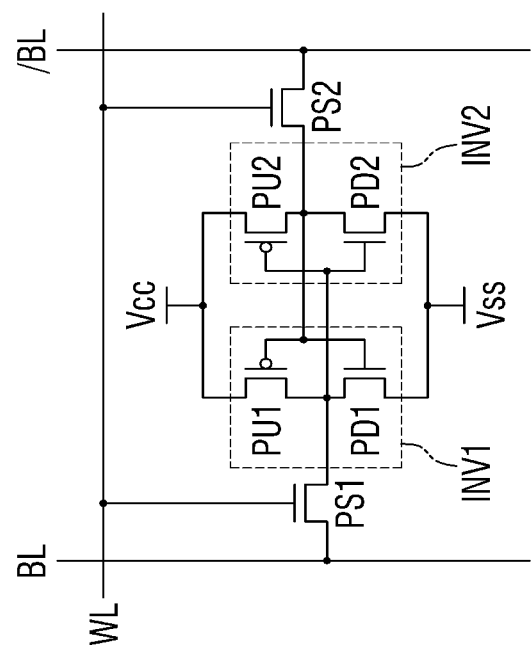
FIG. 1 is a circuit diagram for explaining a semiconductor device according to some embodiments.
Figure 2:
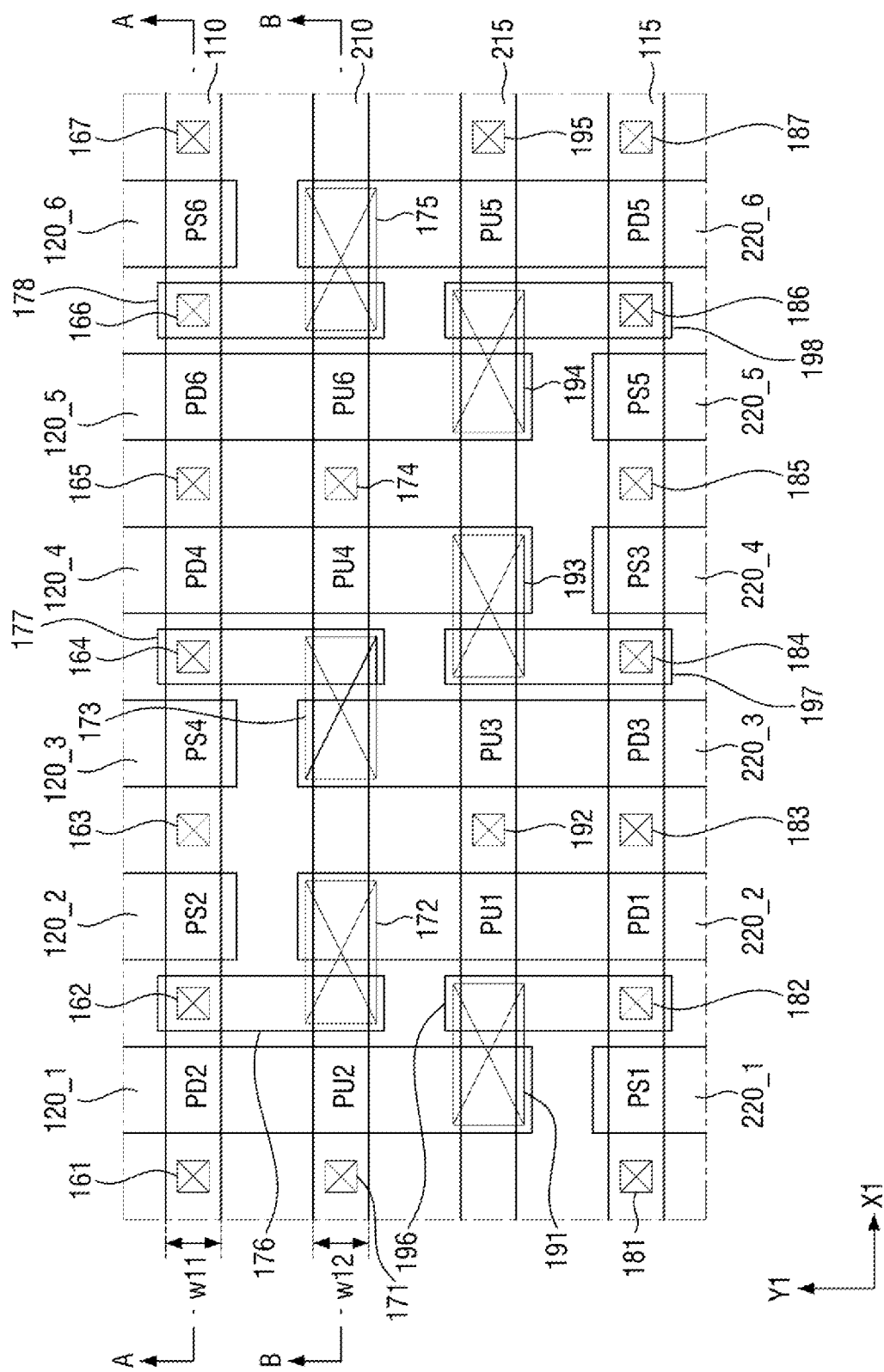
FIG. 2 is an expanded layout diagram of the illustrated semiconductor device of FIG. 1.
Figure 3:
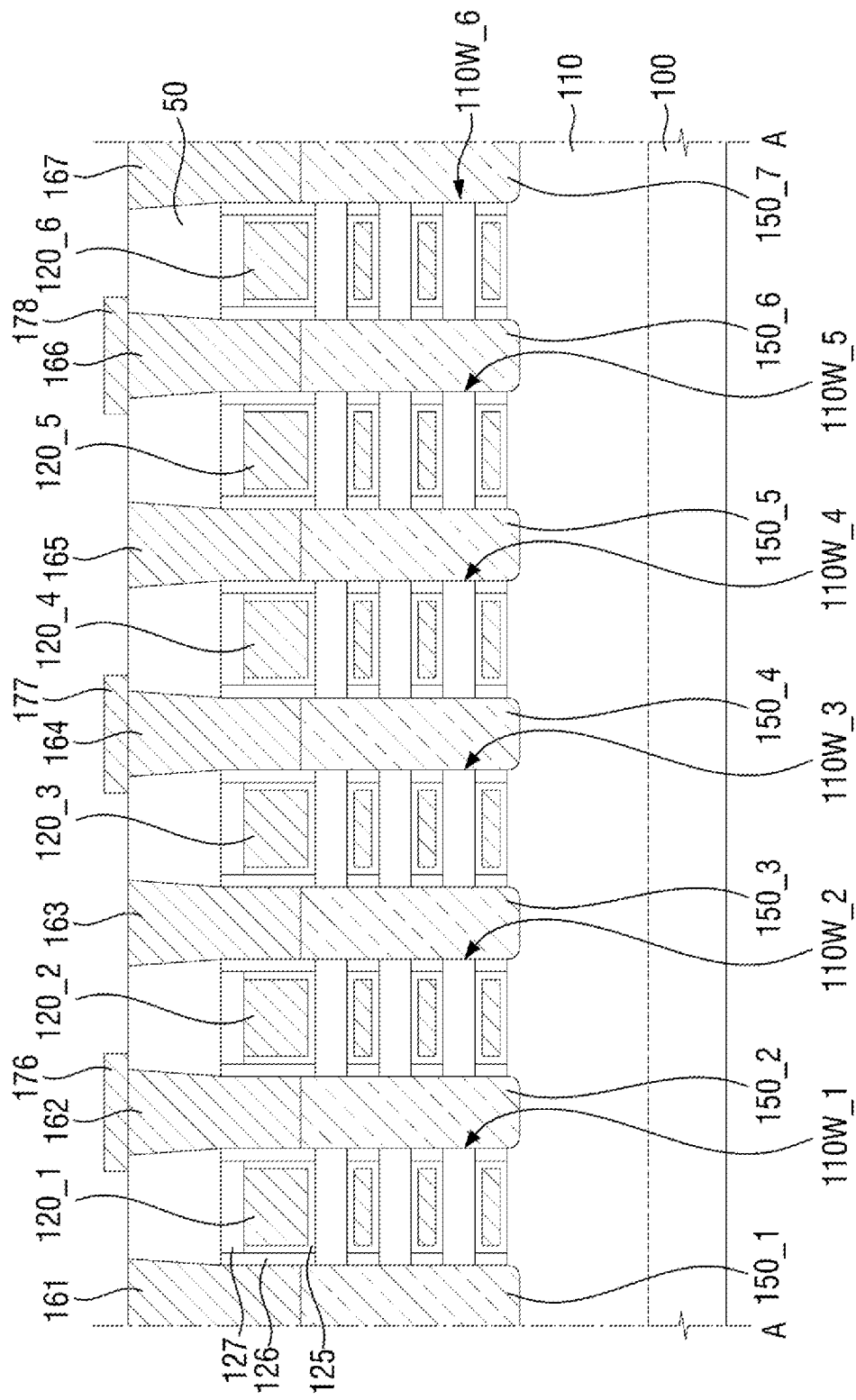
FIG. 3 is a cross-sectional view taken along line A-A of FIG. 2.
Figure 4:
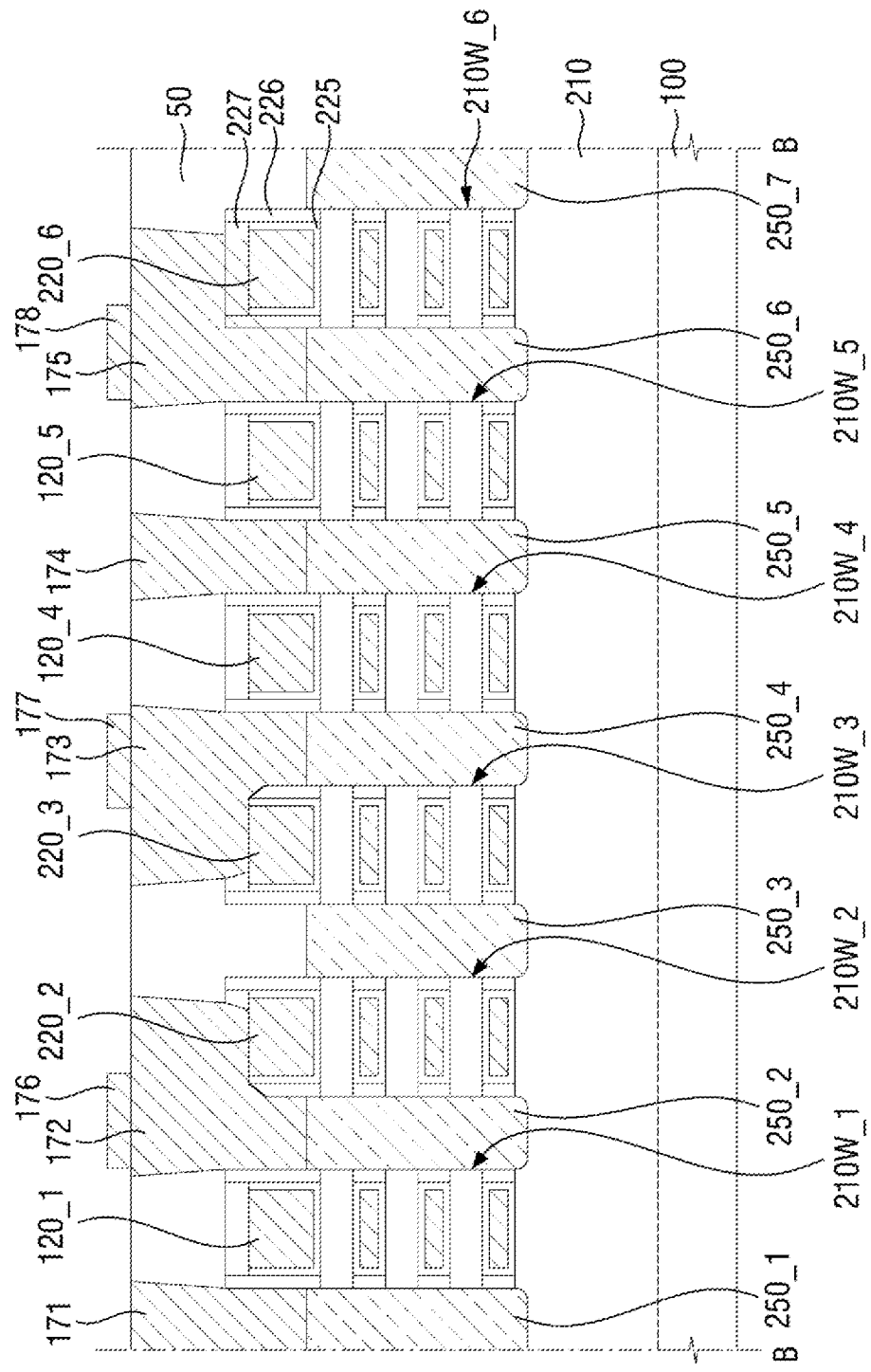
FIG. 4 is a cross-sectional view taken along line B-B of FIG. 2.

FIG. 1 is a circuit diagram for explaining a semiconductor device according to some embodiments. FIG. 2 is an expanded layout diagram of the illustrated semiconductor device of FIG. 1. FIG. 3 is a cross-sectional view taken along line A-A of FIG. 2. FIG. 4 is a cross-sectional view taken along line B-B of FIG. 2.

For reference, FIG. 2 may be an exemplary layout diagram in which a pair of inverters INV1 and INV2 described in FIG. 1 may be repeatedly arranged. For example, the FIG. 2 includes three pairs of inverters INV1 and INV2 which are arranged in a first direction X1. The present inventive concept is not limited thereto. In an exemplary embodiment, more than or less than three pairs of inverters INV1 and INV2 may be arranged in the first direction X1.

Referring to FIG. 1, the semiconductor device according to some embodiments includes the pair of inverters INV1 and INV2 connected in parallel between a power supply node Vcc and a ground node Vss, and a first pass transistor PS1 and a second pass transistor PS2 connected to the output nodes of the inverters INV1 and INV2 respectively. In an exemplary embodiment, the semiconductor device may be a static random access memory (SRAM) formed of, for example, six transistors. In this case, FIG. 2 shows a layout for three SRAMs arranged in the first direction. The present inventive concept is not limited thereto. The semiconductor device may include more than or less than six transistors.

The first pass transistor PS1 and the second pass transistor PS2 may be connected to a bit line BL and a complementary bit line BL, respectively. The gates of the first pass transistor PS1 and the second pass transistor PS2 may be connected to a word line WL.

The first inverter INV1 includes a first pull-up transistor PU1 and a first pull-down transistor PD1 connected in series, and a second inverter INV2 includes a second pull-up transistor PU2 and a second pull-down transistor PD2 connected in series. The first pull-up transistor PU1 and the second pull-up transistor PU2 may be P-type transistors, and the first pull-down transistor PD1 and the second pull-down transistor PD2 may be N-type transistors.

The first inverter INV1 and the second inverter INV2 are cross-coupled to constitute one latch circuit. For example, the input node of the first inverter INV1 is connected to the output node of the second inverter INV2, and the input node of the second inverter INV2 is connected to the output node of the first inverter INV1.

Referring to FIGS. 2 to 4, the semiconductor device according to some embodiments may include a first fin type pattern 110, a second fin type pattern 210, a third fin type pattern 215, a fourth fin type pattern 115, a plurality of first gate patterns 120_1, 120_2, 120_3, 120_4, 120_5 and 120_6, and a plurality of second gate patterns 220_1, 220_2, 220_3, 220_4, 220_5 and 220_6.

The substrate 100 may be bulk silicon or silicon-on-insulator (SOI). Alternatively, the substrate 100 may be a silicon substrate and may include, but is not limited to, other materials, for example, silicon germanium, silicon germanium on insulator (SGOI), indium antimonide, lead tellurium compound, indium arsenide, indium phosphide, gallium arsenide or gallium antimonide.

Each of the first fin type pattern 110, the second fin type pattern 210, the third fin type pattern 215, and the fourth fin type pattern 115 may protrude from the substrate 100.

Each of the first fin type pattern 110, the second fin type pattern 210, the third fin type pattern 215, and the fourth fin type pattern 115 extends lengthwise in the first direction X1. Each of the first fin type pattern 110, the second fin type pattern 210, the third fin type pattern 215, and the fourth fin type pattern 115 may be disposed to be spaced apart from each other in a second direction Y1 different from the first direction X1.

The second fin type pattern 210 and the third fin type pattern 215 are disposed between the first fin type pattern 110 and the fourth fin type pattern 115. The second fin type pattern 210 is disposed between the first fin type pattern 110 and the third fin type pattern 215.

Each of the first fin type pattern 110, the second fin type pattern 210, the third fin type pattern 215, and the fourth fin type pattern 115 may be disposed in an SRAM region. The first fin type pattern 110 and the fourth fin type pattern 115 may be disposed in an N-type metal-oxide-semiconductor (NMOS) region of the SRAM. The second fin type pattern 210 and the third fin type pattern 215 may be disposed in a P-type metal-oxide-semiconductor (PMOS) region of the SRAM.

A width of the first fin type pattern 110 in the second direction Y1 may be a first width W11, and a width of the second fin type pattern 210 in the second direction Y1 may be a second width W12. In the semiconductor device according to some embodiments, the first width W11 may be substantially the same as the second width W12.

A width of the third fin type pattern 215 in the second direction Y1 may be substantially the same as the second width W12, and a width of the fourth fin type pattern 115 in the second direction Y1 may be substantially the same as the first width W11. Here, the width, when used together with "substantially the same," includes not only a case in which the widths of the two fin type patterns to be compared are exactly the same, but also a fine difference in width which may occur due to a process margin or the like.

Each of the first to fourth fin type patterns 110, 210, 215 and 115 may be formed by etching a part of the substrate 100. The present inventive concept is not limited thereto. In an exemplary embodiment, each of the first to fourth fin type patterns 110, 210, 215 and 115 may be formed of an epitaxial layer grown from the substrate 100. Each of the first to fourth fin type patterns 110, 210, 310 and 410 may include silicon or germanium which is a semiconductor material element. Also, each of the first to fourth fin type patterns 110, 210, 310 and 410 may include a compound semiconductor, and may include, for example, a group IV-IV compound semiconductor or a group III-V compound semiconductor. The group IV-IV compound semiconductor may be, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, a binary compound, a ternary compound, or a quaternary compound formed by combining at least one of aluminum (Al), gallium (Ga) and indium (In) as a group III element, and at least one of phosphorus (P), arsenic (As) and antimonium (Sb) as a group V element.

Each of the plurality of first gate patterns 120_1, 120_2, 120_3, 120_4, 120_5 and 120_6 extends lengthwise in the second direction Y1. The first gate patterns 120_1, 120_2, 120_3, 120_4, 120_5 and 120_6 are spaced apart from each other in the first direction X1. The plurality of first gate patterns 120_1, 120_2, 120_3, 120_4, 120_5 and 120_6 are sequentially disposed in the first direction X1.

The plurality of first gate patterns 120_1, 120_2, 120_3, 120_4, 120_5 and 120_6 intersect the first fin type pattern 110. A first_1 gate pattern 120_1, a first_4 gate pattern 120_4, and a first_5 gate pattern 120_5 further intersect the second fin type pattern 210 and the third fin type pattern 215. Meanwhile, a first_2 gate pattern 120_2, a first_3 gate pattern 120_3 and a first_6 gate pattern 120_6 intersect the first fin type pattern without intersecting the second fin type pattern 210 and the third fin type pattern 215.

Each of the plurality of second gate patterns 220_1, 220_2, 220_3, 220_4, 220_5 and 220_6 extends lengthwise in the second direction Y1. The second gate patterns 220_1, 220_2, 220_3, 220_4, 220_5 and 220_6 are spaced apart from each other in the first direction X1. The plurality of second gate patterns 220_1, 220_2, 220_3, 220_4, 220_5 and 220_6 are sequentially disposed in the first direction X1.

The plurality of second gate patterns 220_1, 220_2, 220_3, 220_4, 220_5 and 220_6 intersect the fourth fin type pattern 115. A second_2 gate pattern 220_2, a second_3 gate pattern 220_3 and a second_6 gate pattern 220_6 further intersect the second fin type pattern 210 and the third fin type pattern 215. Meanwhile, a second_1 gate pattern 220_1, a second_4 gate pattern 220_4, and a second_5 gate pattern 220_5 intersect the fourth fin type pattern 115 without intersecting the second fin type pattern 210 and the third fin type pattern 215.

The first gate patterns 120_1, 120_2, 120_3, 120_4, 120_5 and 120_6 are spaced apart from the second gate patterns 220_1, 220_2, 220_3, 220_4, 220_5 and 220_6 in the second direction Y1, respectively. For example, the first_1 gate pattern 120_1 is spaced apart from the second_1 gate pattern 220_1 in the second direction Y1.

Each of the first gate patterns 120_1, 120_2, 120_3, 120_4, 120_5 and 120_6 and each of the second gate patterns 220_1, 220_2, 220_3, 220_4, 220_5 and 220_6 may include at least one of metal, conductive metal nitride, metal silicide, doped semiconductor material and conductive metal oxynitride.

As illustrated, a first pull-up transistor PU1 is defined around an intersection region between the second_2 gate pattern 220_2 and the third fin type pattern 215, a first pull-down transistor PD1 is defined around an intersection region between the second_2 gate pattern 220_2 and the fourth fin type pattern 115, and a first pass transistor PS1 is defined around an intersection region between the second_1 gate pattern 220_1 and a fourth fin type pattern 115.

A second pull-up transistor PU2 is defined around an intersection region between the first_1 gate pattern 120_1 and the second fin type pattern 210, a second pull-down transistor PD2 is defined around an intersection region between the first_1 gate pattern 120_1 and the first fin type pattern 110, and a second pass transistor PS2 is defined around an intersection region between the first_2 gate pattern 120_2 and the first fin type pattern 110.

A third pull-up transistor PU3 is defined around an intersection region between the second_3 gate pattern 220_3 and the third fin type pattern 215, a third pull-down transistor PD3 is defined around an intersection region between the second_3 gate pattern 220_3 and the fourth fin type pattern 115, and a third pass transistor PS3 is defined around an intersection region between the second_4 gate pattern 220_4 and the fourth fin type pattern 115.

A fourth pull-up transistor PU4 is defined around an intersection region between the first_4 gate pattern 120_4 and the second fin type pattern 210, a fourth pull-down transistor PD4 is defined around an intersection region between the first_4 gate pattern 120_4 and the first fin type pattern 110, and a fourth pass transistor PS4 is defined around an intersection region between the first_3 gate pattern 120_3 and the first fin type pattern 110.

A fifth pull-up transistor PU5 is defined around an intersection region between the second_6 gate pattern 220_6 and the third fin type pattern 215, a fifth pull-down transistor PD5 is defined around an intersection region between the second_6 gate pattern 220_6 and the fourth fin type pattern 115, and a fifth pass transistor PS5 is defined around an intersection region between the second_5 gate pattern 220_5 and the fourth fin type pattern 115.

A sixth pull-up transistor PU6 is defined around an intersection region between the first_5 gate pattern 120_5 and the second fin type pattern 210, a sixth pull-down transistor PD6 is defined around an intersection region between the first_5 gate pattern 120_5 and the first fin type pattern 110, and a sixth pass transistor PS6 is defined around an intersection region between the first_6 gate pattern 120_6 and the first fin type pattern 110.

The first and second pull-up transistors PU1 and PU2, the first and second pull-down transistors PD1 and PD2, and the first and second pass transistors PS1 and PS2 may be included in a first SRAM cell. The third and fourth pull-up transistors PU3 and PU4, the third and fourth pull-down transistors PD3 and PD4, and the third and fourth pass transistors PS3 and PS4 may be included in a second SRAM cell. The fifth and sixth pull-up transistors PU5 and PU6, the fifth and sixth pull-down transistors PD5 and PD6, and the fifth and sixth pass transistors PS5 and PS6 may be included in a third SRAM cell.

Each SRAM cell may be connected to each of a bit line BL and a complementary bit line BL.

A plurality of first nanosheet structures 110W_1, 110W_2, 110W_3, 110W_4, 110W_5 and 110W_6 may be disposed on the substrate 100. The plurality of first nanosheet structures 110W_1, 110W_2, 110W_3, 110W_4, 110W_5 and 110W_6 may be disposed on the first fin type pattern 110. The plurality of first nanosheet structures 110W_1, 110W_2, 110W_3, 110W_4, 110W_5 and 110W_6 spaced apart from each other may be arranged in the first direction X1 on the upper surface of the first fin type pattern 110.

A plurality of second nanosheet structures 210W_1, 210W_2, 210W_3, 210W_4, 210W_5 and 210W_6 may be disposed on the substrate 100. The plurality of second nanosheet structures 210W_1, 210W_2, 210W_3, 210W_4, 210W_5 and 210W_6 may be disposed on the second fin type pattern 210. The plurality of second nanosheet structures 210W_1, 210W_2, 210W_3, 210W_4, 210W_5 and 210W_6 spaced apart from one another may be arranged in the first direction X1 on the upper surface of the second fin type pattern 210.

Each of the first nanosheet structures 110W_1, 110W_2, 110W_3, 110W_4, 110W_5 and 110W_6 includes a plurality of nanosheets that are sequentially stacked in the thickness direction of the substrate 100. Each of the second nanosheet structures 210W_1, 210W_2, 210W_3, 210W_4, 210W_5 and 210W_6 includes a plurality of nanosheets that are sequentially stacked in the thickness direction of the substrate 100.

In FIGS. 3 and 4, for the convenience of description, each of the first nanosheet structures 110W_1, 110W_2, 110W_3, 110W_4, 110W_5 and 110W_6 is formed of three nanosheets that are sequentially stacked in the thickness direction of the substrate 100, and each of the second nanosheet structures 210W_1, 210W_2, 210W_3, 210W_4, 210W_5 and 210W_6 is formed of three nanosheets that are sequentially stacked in the thickness direction of substrates 100. The present inventive concept is not limited thereto. In an exemplary embodiment, each nanosheet structure may be formed of more than or less than three nanosheets.

Although not illustrated, a plurality of nanosheets spaced apart from each other in the first direction X1 may also be disposed on the third fin type pattern 215 and the fourth fin type pattern 115.

The first nanosheet structures 110W_1, 110W_2, 110W_3, 110W_4, 110W_5 and 110W_6 and the second nanosheet structures 210W_1, 210W_2, 210W_3, 210W_4, 210W_5 and 210W_6 may include one of silicon or germanium as a semiconductor material element, a group IV-IV compound semiconductor or a group III-V compound semiconductor.

A width of the first nanosheet structures 110W_1, 110W_2, 110W_3, 110W_4, 110W_5 and 110W_6 in the second direction Y1 may increase or decrease in proportional to the width of the first fin type pattern 110 in the second direction Y1.

The first gate patterns 120_1, 120_2, 120_3, 120_4, 120_5 and 120_6 may wrap around the first nanosheet structures 110W_1, 110W_2, 110W_3, 110W_4, 110W_5 and 110W_6, respectively.

The first_1 gate pattern 120_1, the second_2 gate pattern 220_2, the second_3 gate pattern 220_3, the first_4 gate pattern 120_4, the first_5 gate pattern 120_5 and the second_6 gate pattern 220_6 sequentially disposed in the first direction X1 may wrap around the second nanosheet structures 210W_1, 210W_2, 210W_3, 210W_4, 210W_5 and 210W_6, respectively. For example, the first_1 gate pattern 120_1 may wrap around each of the three nanosheets of the second nanosheet structure 210W_1.

A first gate insulating film 125 may wrap around the first nanosheet structures 110W_1, 110W_2, 110W_3, 110W_4, 110W_5 and 110W_6. For example, the first gate insulating film 125 may wrap around each of the plurality of nanosheets in the first nanosheet structures 110W_1, 110W_2, 110W_3, 110W_4, 110W_5 and 110W_6. A second gate insulating film 225 may wrap around the second nanosheet structures 210W_1, 210W_2, 210W_3, 210W_4, 210W_5 and 210W_6. For example, the second gate insulating film 225 may wrap around each of the plurality of nanosheets in the second nanosheet structures 210W_1, 210W_2, 210W_3, 210W_4, 210W_5 and 210W_6. The first and second gate insulating films 125 and 225 may include at least one of silicon oxide, silicon oxynitride, silicon nitride, and a high-K material having a dielectric constant higher than that of silicon oxide.

A first gate spacer 126 may be disposed on the sides of each of the first gate patterns 120_1, 120_2, 120_3, 120_4, 120_5 and 120_6. The second gate spacer 226 may be disposed on the sides of each of the second gate patterns 220_1, 220_2, 220_3, 220_4, 220_5 and 220_6. The first and second gate spacers 126 and 226 may include an insulating material.

A first capping pattern 127 may be disposed on the upper surface of each of the first gate patterns 120_1, 120_2, 120_3, 120_4, 120_5 and 120_6. The second capping pattern 227 may be disposed on the upper surfaces of each of the second gate patterns 220_1, 220_2, 220_3, 220_4, 220_5 and 220_6. The first and second capping patterns 127 and 227 may include an insulating material.

Unlike an illustrated case, the first capping pattern 127 and the second capping pattern 227 may be omitted.

A plurality of first semiconductor patterns 150_1, 150_2, 150_3, 150_4, 150_5, 150_6 and 150_7 may be disposed on the first fin type pattern 110. Each of the first semiconductor patterns 150_1, 150_2, 150_3, 150_4, 150_5, 150_6 and 150_7 may be connected to the first nanosheet structures 110W_1, 110W_2, 110W_3, 110W_4, 110W_5 and 110W_6 adjacent thereto. For example, the first semiconductor pattern 150_1 is connected to the first nanosheet structure 110W_1 adjacent to the first semiconductor pattern 150_1, and the first semiconductor pattern 150_2 is connected to two first nanosheet structures 110W_1 and 110W_2 adjacent to the first semiconductor pattern 150_2.

A plurality of second semiconductor patterns 250_1, 250_2, 250_3, 250_4, 250_5, 250_6 and 250_7 may be disposed on the second fin type pattern 210. Each of the second semiconductor patterns 250_1, 250_2, 250_3, 250_4, 250_5, 250_6 and 250_7 may be connected to at least one of the second nanosheet structures 210W_1, 210W_2, 210W_3, 210W_4, 210W_5 and 210W_6 adjacent thereto. For example, the second semiconductor pattern 250_1 is connected to the second nanosheet structure 210W_1, and the second semiconductor pattern 250_2 is connected to two second nanosheet structures 210W_1 and 210W_2 adjacent to the second semiconductor pattern 250_2.

Since the first semiconductor patterns 150_1, 150_2, 150_3, 150_4, 150_5, 150_6 and 150_7 are disposed in the NMOS region, the first semiconductor patterns 150_1, 150_2, 150_3, 150_4, 150_5, 150_6, and 150_7 may include Si or SiC.

Since the second semiconductor patterns 250_1, 250_2, 250_3, 250_4, 250_5, 250_6 and 250_7 are disposed in the PMOS region, the second semiconductor patterns 250_1, 250_2, 250_3, 250_4, 250_5, 250_6, and 250_7 may include, for example, SiGe.

Each of the second semiconductor patterns 250_1, 250_2, 250_3, 250_4, 250_5, 250_6 and 250_7 may be disposed at a position corresponding to one of the first semiconductor patterns 150_1, 150_2, 150_3, 150_4, 150_5, 150_6 and 150_7. For example, the second semiconductor patterns 250_1, 250_2, 250_3, 250_4, 250_5, 250_6 and 250_7 may be arranged with the first semiconductor patterns 150_1, 150_2, 150_3, 150_4, 150_5, 150_6 and 150_7 in the second direction Y1, respectively.

An interlayer insulating film 50 covers each of the first gate patterns 120_1, 120_2, 120_3, 120_4, 120_5 and 120_6 and each of the second gate patterns 220_1, 220_2, 220_3, 220_4, 220_5 and 220_6. The interlayer insulating film 50 also covers an upper surface of some second semiconductor patterns 250_3 and 250_7 which are not connected to the wiring structure (i.e., electrically in a floating state). In an exemplary embodiment, the interlayer insulating film 50 is in contact with the upper surface of some second semiconductor patterns 250_3 and 250_7. The word "contact" or the phrase "in contact with" refers to a direct connection i.e. touching. Unlike the other second semiconductor patterns 250_1, 250_2, 250_4, 250_5 and 250_6 each of which being in contact with a corresponding contact of the plurality of contacts 171, 172, 173, 174 and 175, some second semiconductor patterns 250_3 and 250_7 are in contact with the interlayer insulating film 50.

A wiring structure may be formed in the interlayer insulating film 50 or may be formed on the interlayer insulating film 50. The wiring structure may include a plurality of contacts 161, 162, 163, 164, 165, 166, 167, 171, 172, 173, 174, 175, 181, 182, 183, 184, 185, 186, 187, 191, 192 193, 194 and 195 and connection wirings 176, 177, 178, 196, 197 and 198.

Some contacts 161, 162, 163, 164, 165, 166 and 167 may be connected to the first semiconductor patterns 150_1, 150_2, 150_3, 150_4, 150_5, 150_6 and 150_7, respectively. Some contacts 171, 172, 173, 174 and 175 may be connected to some second semiconductor patterns 250_1, 250_2, 250_4, 250_5 and 250_6, respectively.

Each of some contacts 181, 182, 183, 184, 185, 186 and 187 may be connected to a corresponding semiconductor pattern formed on the fourth fin type pattern 115. Each of some contacts 191, 192, 193, 194 and 195 may be connected to a corresponding semiconductor pattern formed on the third fin type pattern 215.

In addition, some contacts 172, 173 and 175 among the contacts connected to the second semiconductor patterns 250_1, 250_2, 250_4, 250_5 and 250_6 may be connected to the second gate patterns 220_2, 220_3 and 220_6. For example, the contact 172 may be simultaneously connected to the second_2 semiconductor pattern 250_2 and the second_2 gate pattern 220_2. Some contacts 191, 193 and 194 connected to the semiconductor pattern formed on the third fin type pattern 215 may also be connected to some first gate patterns 120_1, 120_4 and 120_5.

Meanwhile, some second semiconductor patterns 250_3 and 250_7 are not connected to the wiring structure. That is, some second semiconductor patterns 250_3 and 250_7 are not connected to any contact of the wiring structure. Some second semiconductor patterns 250_3 and 250_7 may be electrically in a floating state. The second semiconductor patterns 250_3 and 250_7 are not electrically connected to the wiring structure.

Some contacts 161, 165, 183 and 187 may be connected to a ground node (Vss of FIG. 1). Some contacts 171, 174, 192 and 195 may be connected to a power supply node (Vcc of FIG. 1). Some contacts 163 and 167 may be connected to a complementary bit lines (BL of FIG. 1). Some contacts 181 and 185 may be connected to a bit line (BL of FIG. 1).

The connection wirings 176, 177, 178, 196, 197 and 198 are formed on the interlayer insulating film 50, and may connect two or more contacts different from each other. For example, the connection wiring 176 may connect the contact 162 connected to the first_2 semiconductor pattern 150_2 and the contact 172 connected to the second_2 semiconductor pattern 250_2. The connection wiring 176 may electrically connect the first_2 semiconductor pattern 150_2, the second_2 semiconductor pattern 250_2, and the second_2 gate pattern 220_2.

The second semiconductor patterns 250_1, 250_2, 250_3, 250_4, 250_5, 250_6 and 250_7 may include a first group connected to the wiring structure, and a second group not connected to the wiring structure. The second semiconductor patterns 250_1, 250_2, 250_4, 250_5 and 250_6 of the first group are connected to the contacts 171, 172, 173, 174 and 175, respectively. For example, the semiconductor patterns 250_1, 250_2, 250_4, 250_5 and 250_6 of the first group are in contact with the contacts 171, 172, 173, 174 and 175, respectively. The second semiconductor patterns 250_3 and 250_7 of the second group are not connected to any contact of the wiring structure. Instead, the second semiconductor patterns 250_3 and 250_7 of the second group are in contact with the interlayer insulating film 50. The second semiconductor patterns 250_1, 250_2, 250_4, 250_5 and 250_6 of the first group and the second semiconductor patterns 250_3 and 250_7 of the second group may be disposed regularly on the second fin type pattern 210. For example, the second semiconductor patterns 250_3 or 250_7 of the second group may be regularly arranged among the second semiconductor patterns 250_1, 250_2, 250_4, 250_5 and 250_6 of the first group.

In addition, the second_5 semiconductor pattern 250_5 located at the center among the three second semiconductor patterns 250_4, 250_5 and 250_6 included in the first group of the second semiconductor patterns may be connected to the power supply node (Vcc of FIG. 1). The second_4 semiconductor pattern 250_4 and the second_6 semiconductor pattern 250_6 may be electrically connected to the first_4 semiconductor pattern 150_4 and the first_6 semiconductor pattern 150_6, respectively. For example, the second_4 semiconductor pattern 250_4 may be electrically connected to the first_4 semiconductor pattern 150_4 via the connection wiring 177, and the second_6 semiconductor pattern 250_6 may be electrically connected to the first_6 semiconductor pattern 150_6 via the connection wiring 178.

Figure 5:
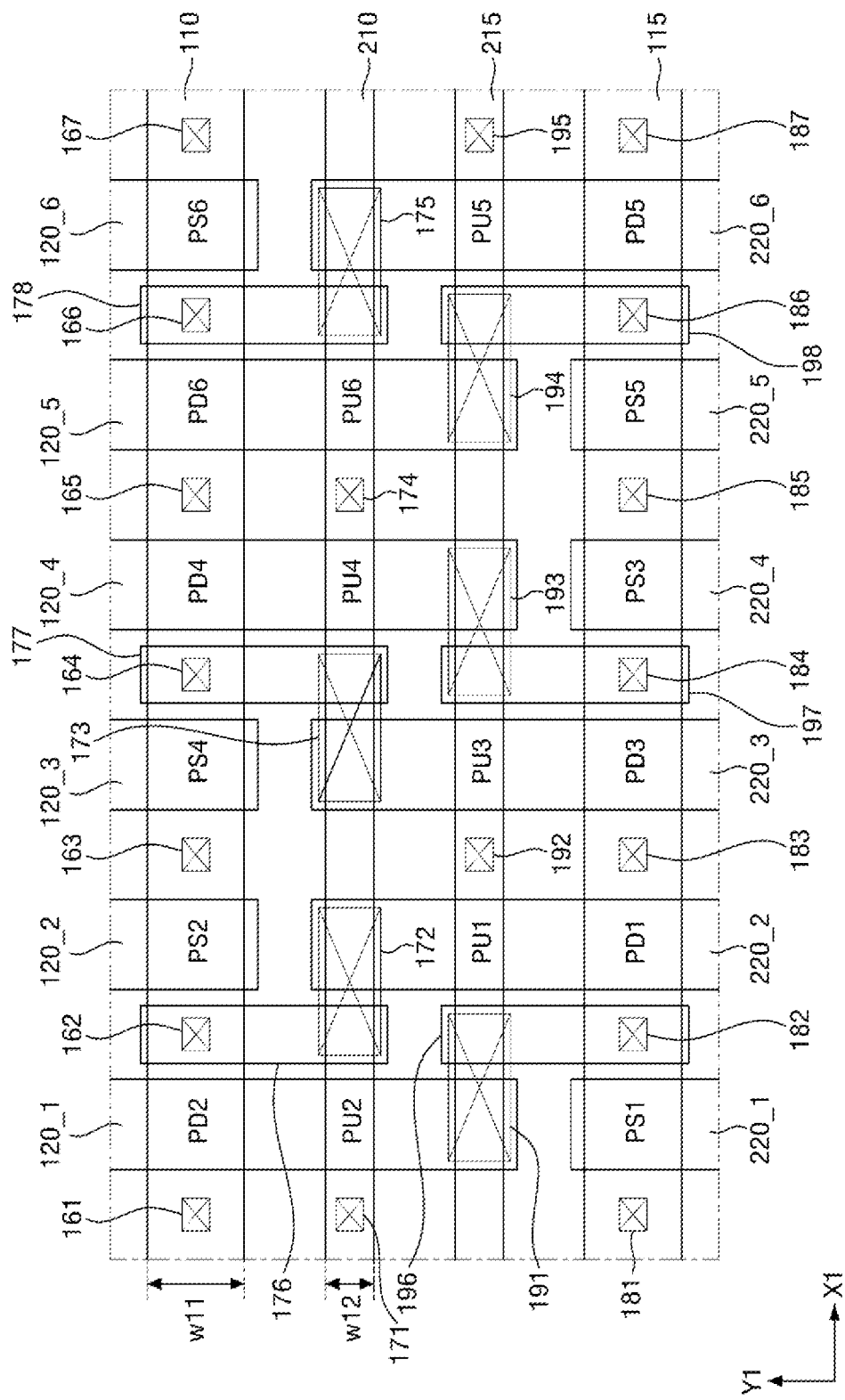
FIG. 5 is a layout diagram for explaining the semiconductor device according to some embodiments.
Figure 6:
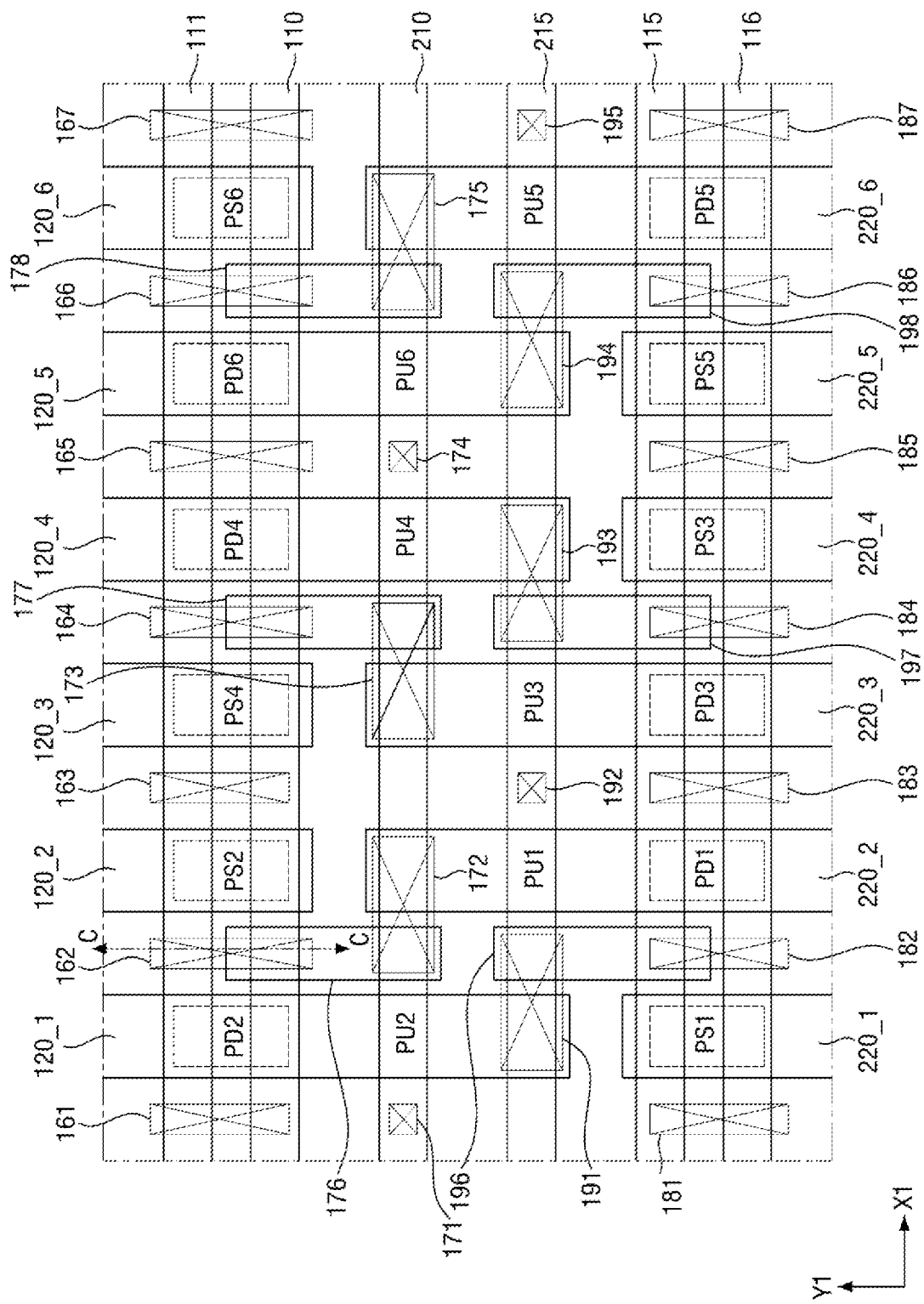
FIGS. 6 and 7 are diagrams for explaining the semiconductor device according to some embodiments.
Figure 7:
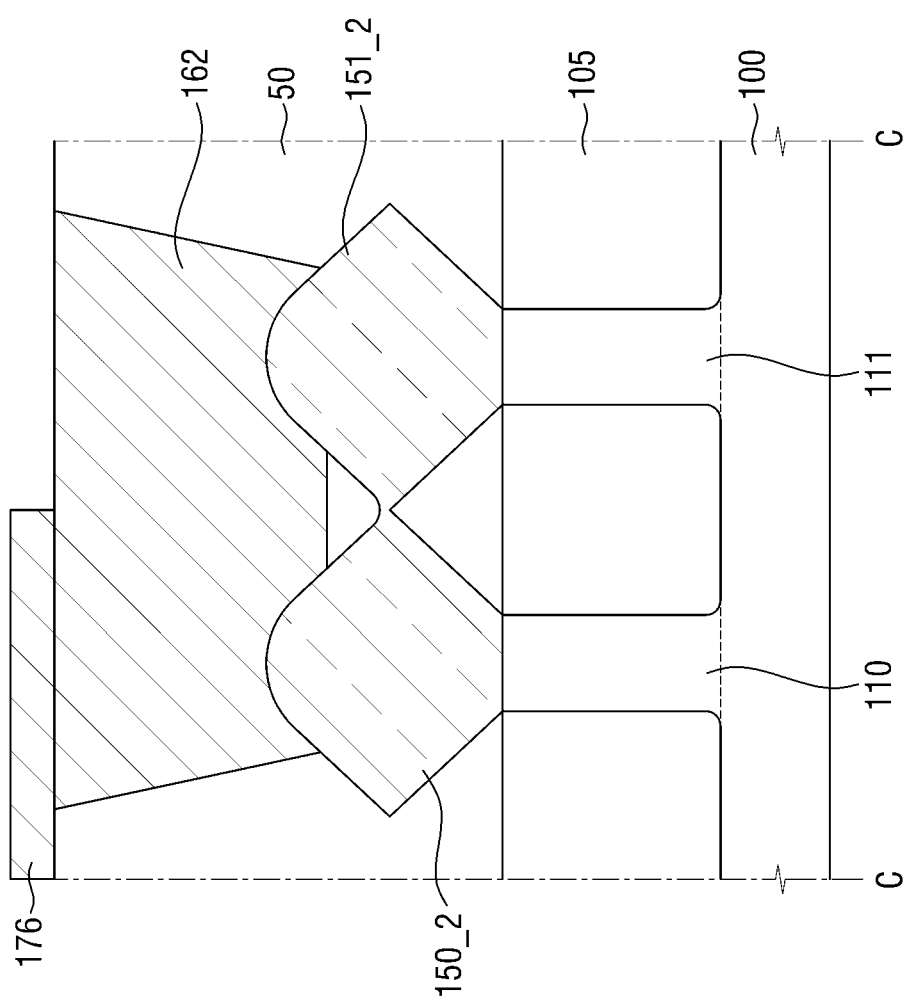

FIG. 5 is a layout diagram for explaining a semiconductor device according to some embodiments. FIGS. 6 and 7 are diagrams for explaining the semiconductor device according to some embodiments. For convenience of explanation, differences from those described using FIGS. 2 to 4 will be mainly described. For reference, FIG. 6 is a layout diagram for explaining the semiconductor device, and FIG. 7 is a cross-sectional view taken along line C-C of FIG. 6.

Referring to FIG. 5, in the semiconductor device according to some embodiments, a width W11 in the second direction Y1 of the first fin type pattern 110 disposed in the NMOS region is different from a width W12 in the second direction Y1 of the second fin type pattern 210 disposed in the PMOS region.

For example, the width W11 in the second direction Y1 of the first fin type pattern 110 is greater than the width W12 in the second direction Y1 of the second fin type pattern 210.

Referring to FIGS. 6 and 7, the semiconductor device according to some embodiments may further include a first_1 fin type pattern 111 and a fourth_1 fin type pattern 116 extending lengthwise in the first direction X1.

The first_1 fin type pattern 111 and the fourth_1 fin type pattern 116 may be disposed in the NMOS region of the SRAM. The first fin type pattern 110 may be disposed between the first_1 fin type pattern 111 and the second fin type pattern 210. The fourth fin type pattern 115 may be disposed between the fourth_1 fin type pattern 116 and the third fin type pattern 215.

The plurality of first gate patterns 120_1, 120_2, 120_3, 120_4, 120_5, and 120_6 may intersect the first fin type pattern 110 and the first_1 fin type pattern 111. The plurality of second gate patterns 220_1, 220_2, 220_3, 220_4, 220_5 and 220_6 may intersect the fourth fin type pattern 115 and the fourth_1 fin type pattern 116.

For example, the second pull-down transistor PD2 is defined around an intersection region between the first_1 gate pattern 120_1, the first fin type pattern 110 and the first_1 fin type pattern 111. The second pass transistor PS2 is defined around an intersection region between the first_2 gate pattern 120_2, the first fin type pattern 110, and the first_1 fin type pattern 111.

A plurality of first sub semiconductor patterns may be disposed on the first_1 fin type pattern 111. In an exemplary embodiment, the first sub semiconductor patterns may be disposed at positions of the first_1 fin type pattern 111, each of which may correspond to one of the plurality of first semiconductor patterns 150_1, 150_2, 150_3, 150_4, 150_5, 150_6 and 150_7. For example, each of the first sub semiconductor patterns may be aligned with a corresponding one of the first semiconductor patterns 150_1, 150_2, 150_3, 150_4, 150_5, 150_6 and 150_7 in the second direction Y1. In this case, as shown in FIG. 7, a first_2 sub semiconductor pattern 151_2 and a first_2 semiconductor pattern 150_2 corresponding thereto are arranged in the second direction Y1 and disposed on the first_1 fin type pattern 111. The first_2 semiconductor pattern 150_2 and the first_2 sub semiconductor pattern 151_2 may be arranged in the second direction Y1.

The first_2 semiconductor pattern 150_2 and the first_2 sub semiconductor pattern 151_2 may be connected to the contact 162. Although the first_2 semiconductor pattern 150_2 and the first_2 sub semiconductor pattern 151_2 are illustrated as being directly connected to each other in FIG. 7, the present inventive concept is not limited thereto. The first_2 semiconductor pattern 150_2 and the first_2 sub semiconductor pattern 151_2 may be spaced apart from each other in the second direction Y1 and electrically connected to each other through the contact 162.

A field insulating film 105 disposed on the substrate 100 may cover the sides of the first fin type pattern 110 and the first_1 fin type pattern 111.

Figure 8:
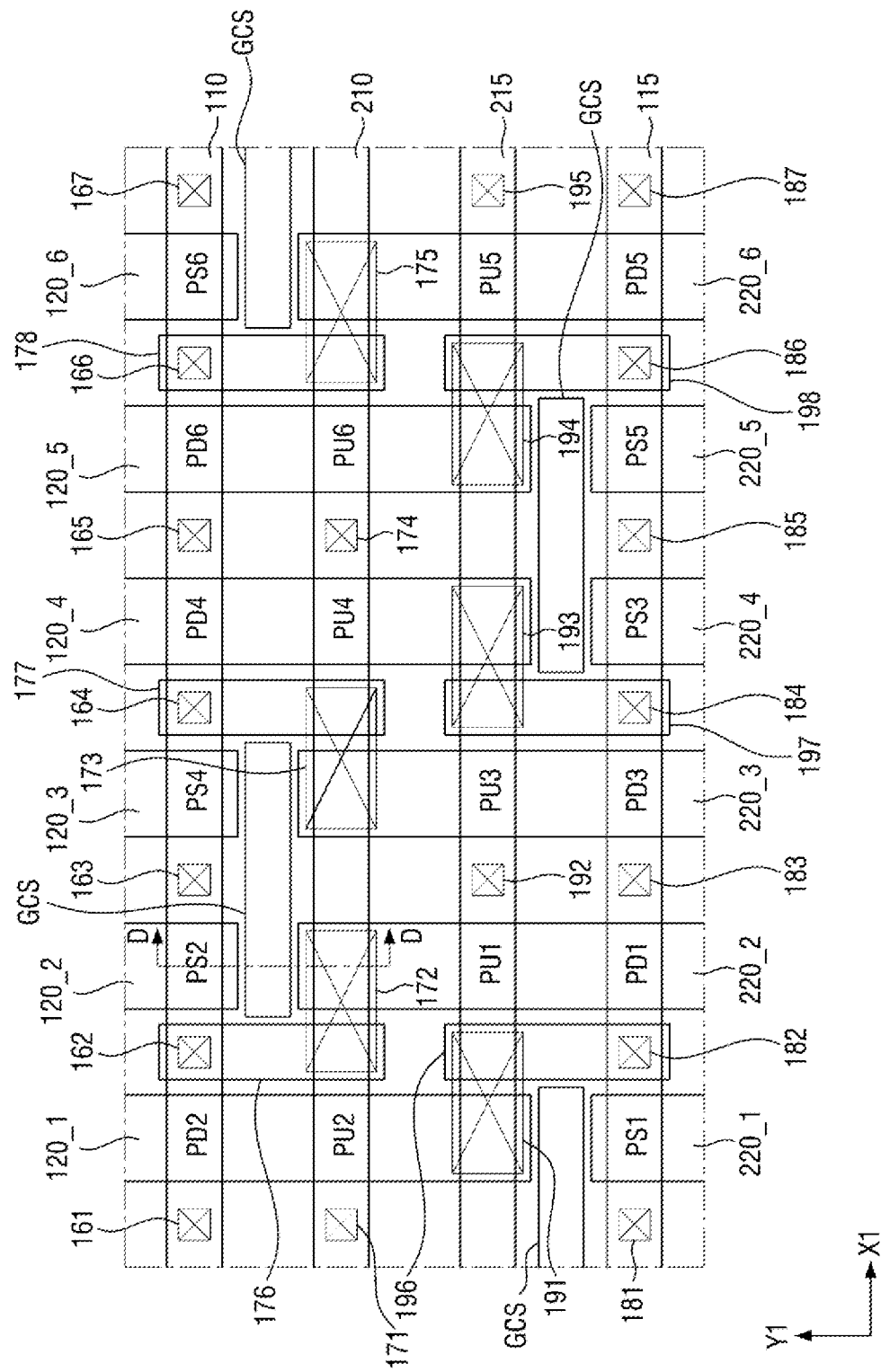
FIG. 8 is a layout diagram for explaining the semiconductor device according to some embodiments.
Figure 9:
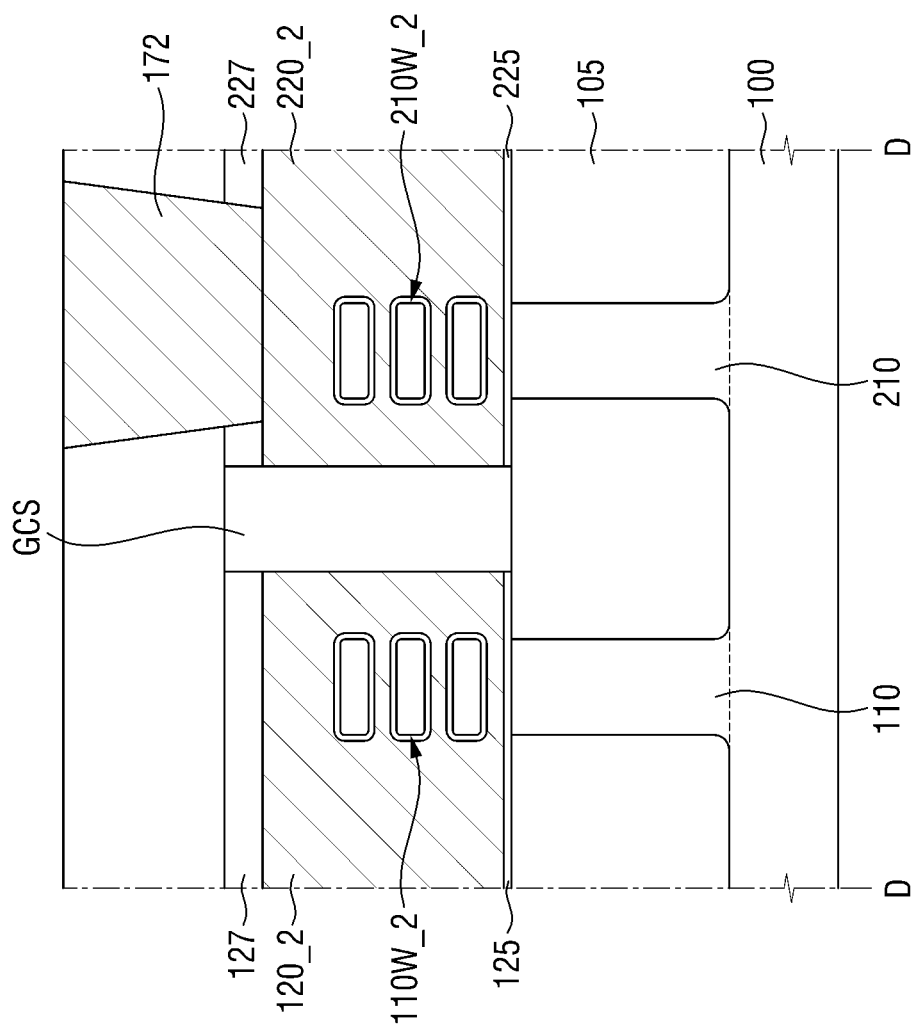
FIGS. 9 and 10 are exemplary cross-sectional views taken along line D-D of FIG. 8, respectively.
Figure 10:
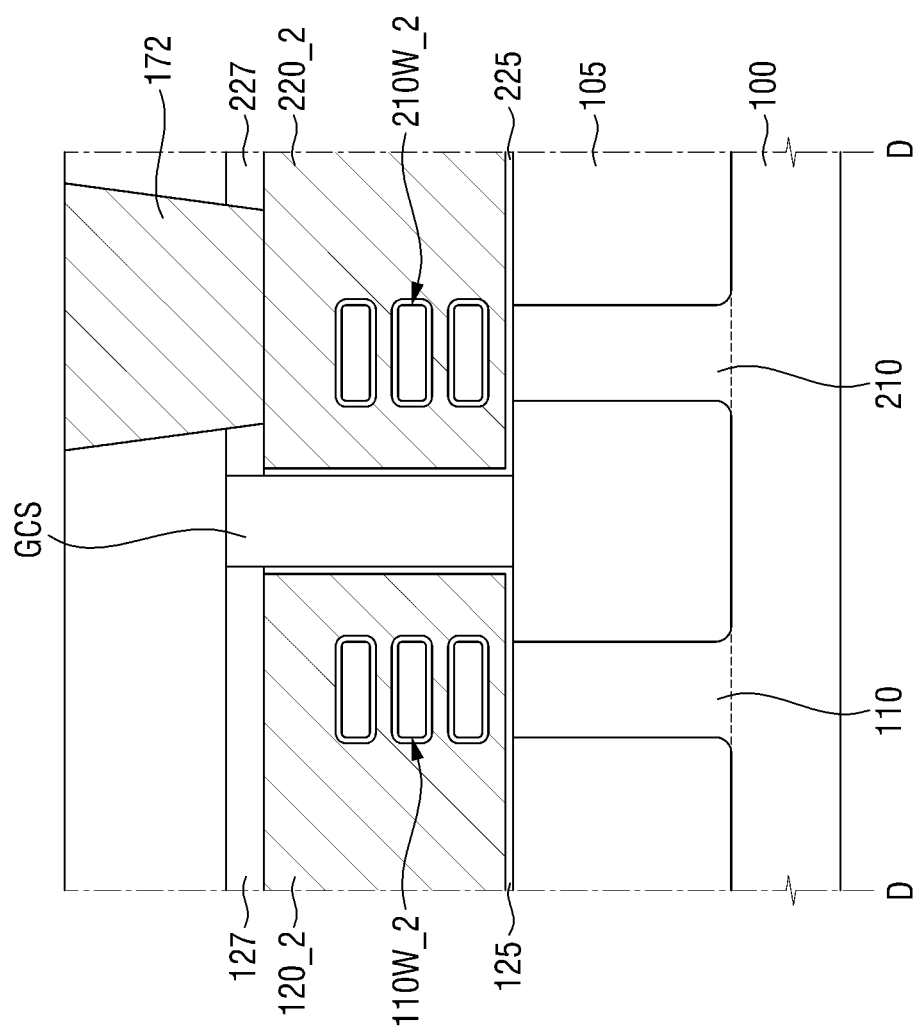

FIG. 8 is a layout diagram for explaining a semiconductor device according to some embodiments. FIGS. 9 and 10 are exemplary cross-sectional views taken along line D-D of FIG. 8, respectively. For convenience of explanation, differences from those described using FIGS. 2 to 4 will be mainly described.

Referring to FIGS. 8 to 10, the semiconductor device according to some embodiments may further include a plurality of gate cut structures GCS which separate the first gate patterns 120_1, 120_2, 120_3, 120_4, 120_5 and 120_6 and the second gate patterns 220_1, 220_2, 220_3, 220_4, 220_5 and 220_6.

The gate cut structures GCS may be disposed between the first gate patterns 120_1, 120_2, 120_3, 120_4, 120_5 and 120_6 and the second gate patterns 220_1, 220_2, 220_3, 220_4, 220_5 and 220_6 which are spaced apart from each other in the second direction Y1 and arranged in the second direction Y1, respectively.

For example, the first_2 gate pattern 120_2 is spaced apart from the second_2 gate pattern 220_2 in the second direction Y1. Also, the first_2 gate pattern 120_2 and the second_2 gate pattern 220_2 are arranged in the second direction Y1. The second gate cut structure GCS2 is disposed between the first_2 gate pattern 120_2 and the second_2 gate pattern 220_2.

In FIG. 8, each of the gate cut structures GCS is formed in a region between two gate patterns adjacent in the second direction Y1, extending lengthwise in in the first direction X1. In other words, each of the gate cut structures GCS cuts two gate patterns extending lengthwise in the second direction Y1. The present inventive concept is not limited thereto. In an exemplary embodiment, each of a plurality of gate cut structures may cut only one gate pattern extending lengthwise in the second direction Y1. Alternatively, a gate cut structure GCS may cut the first gate patterns 120_1 to 120_4, extending lengthwise from the first_1 gate pattern 120_1 to the first_4 gate pattern 120_4.

In FIG. 9, the first gate insulating film 125 and the second gate insulating film 225 may not extend along the sides of the gate cut structures GCS.

In FIG. 10, the first gate insulating film 125 and the second gate insulating film 225 may extend along the sides of the gate cut structures GCS, respectively.

Such a difference in shape may appear, depending on whether the gate cut structure GCS is formed before or after a replacement gate.

Figure 11:
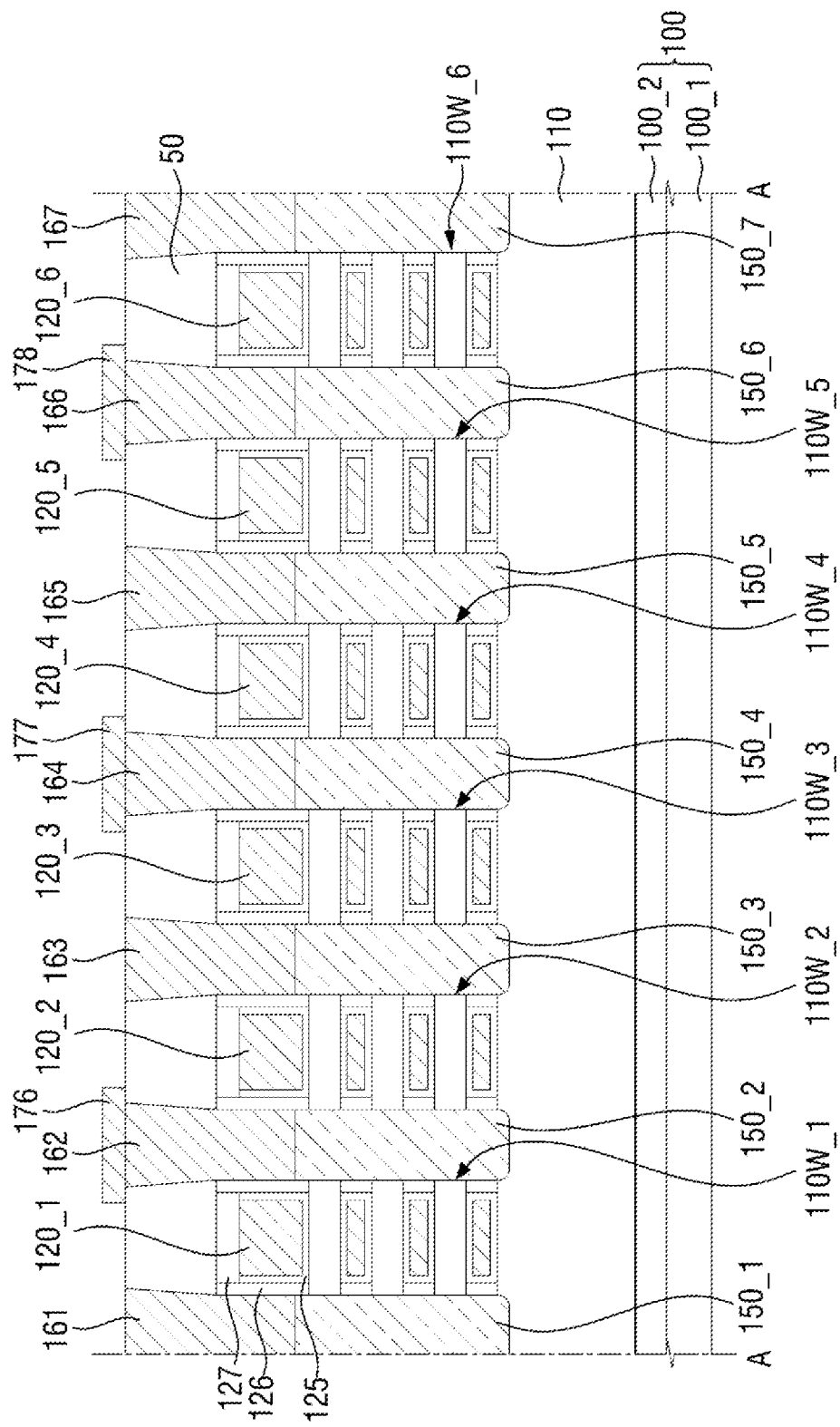
FIG. 11 is a diagram for explaining the semiconductor device according to some embodiments.

FIG. 11 is a diagram for explaining the semiconductor device according to some embodiments. For convenience of explanation, differences from those described using FIGS. 2 to 4 will be mainly described.

Referring to FIG. 11, in the semiconductor device according to some embodiments, the first fin type pattern 110 may be disposed on a buried insulating film 100-2. The first fin type pattern 110 may be disposed on the insulating pattern included in the buried insulating film 100_2.

When describing in a different way, the substrate 100 may include a base substrate 100_1, and the buried insulating film 100_2 stacked on the base substrate 100_1 in the thickness direction of the substrate. The base substrate 100_1 may include a semiconductor material. The buried insulating film 100_2 may include at least one of an insulating material, for example, silicon nitride (SiN), silicon oxynitride (SiON) and silicon oxide (SiO$_2$).

For example, the substrate 100 may be, but is not limited to, a silicon-on-insulator (SOI) substrate or a SiGe-on-insulator (SGOI) substrate.

Figure 12:
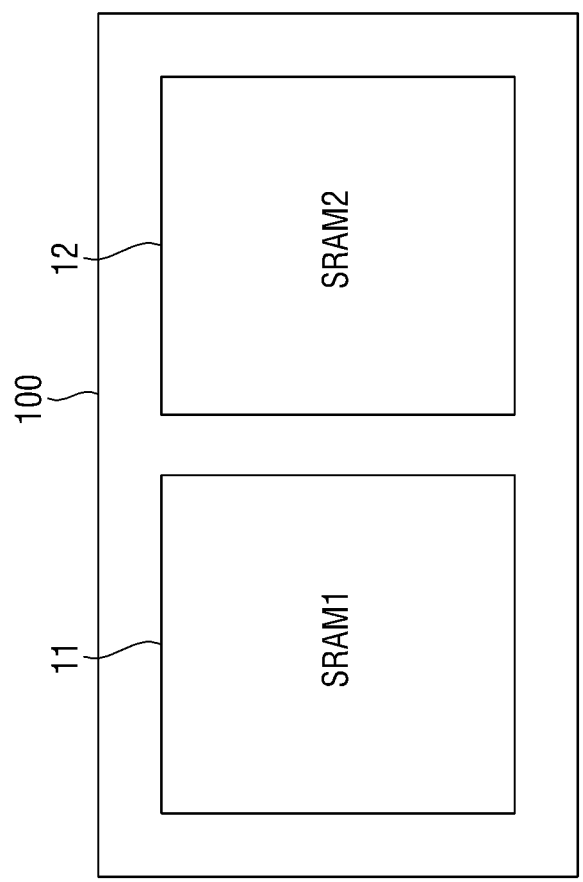
FIG. 12 is a diagram for explaining the semiconductor device according to some embodiments.
Figure 13:
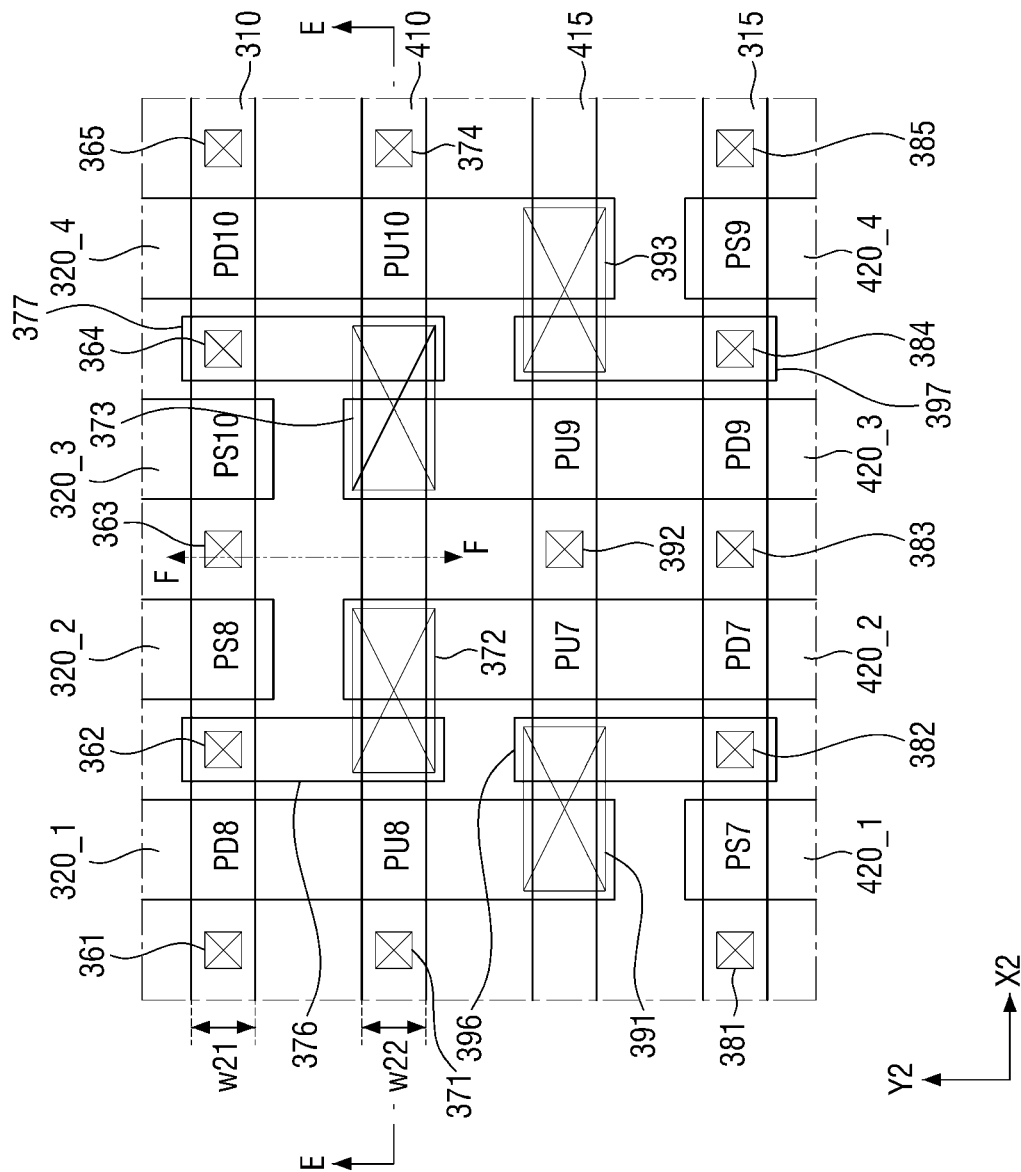
FIG. 13 is a layout diagram of the semiconductor device included in a first SRAM region of FIG. 12.
Figure 14:
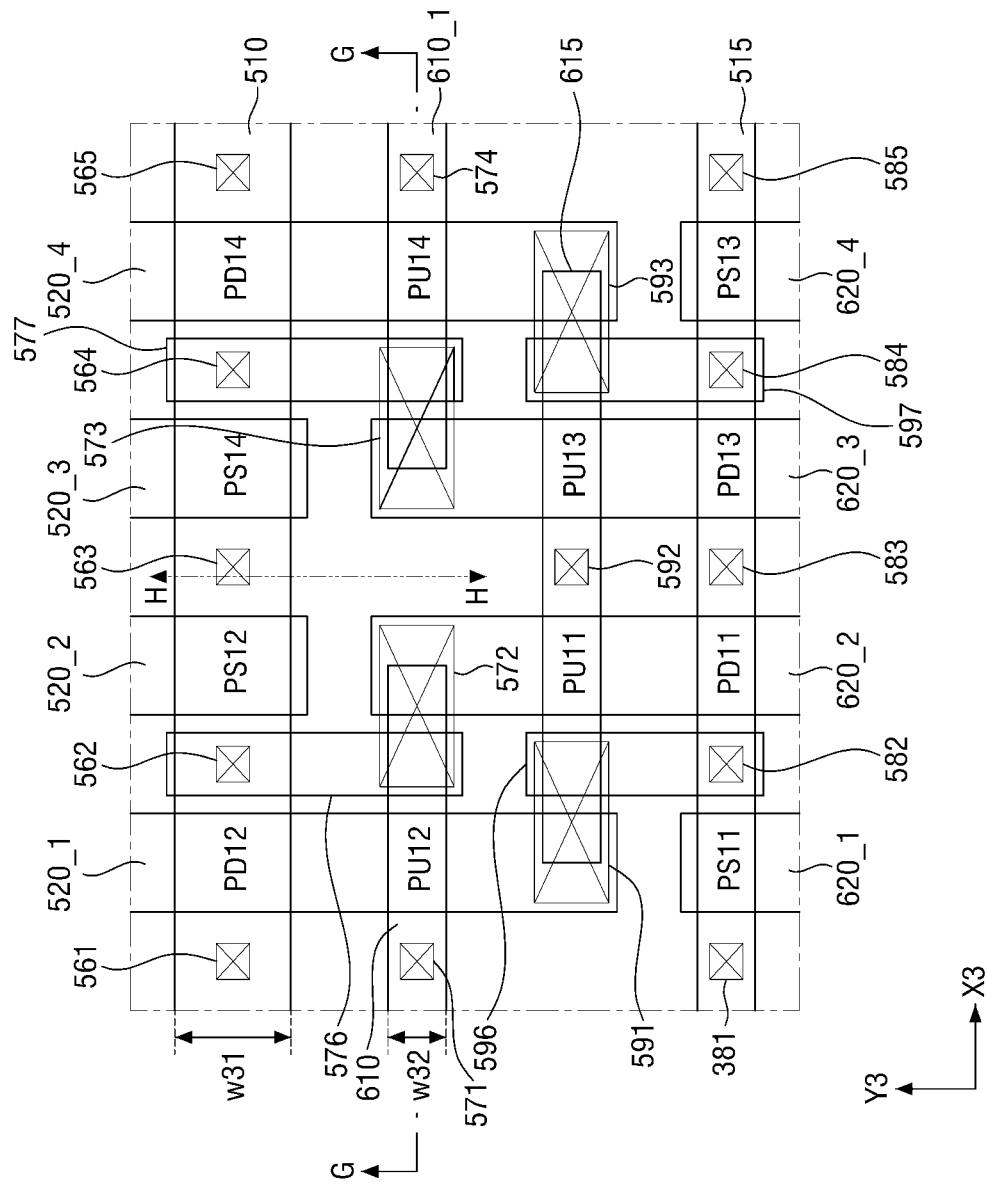
FIG. 14 is a layout diagram of the semiconductor device included in a second SRAM region of FIG. 12.
Figure 15:
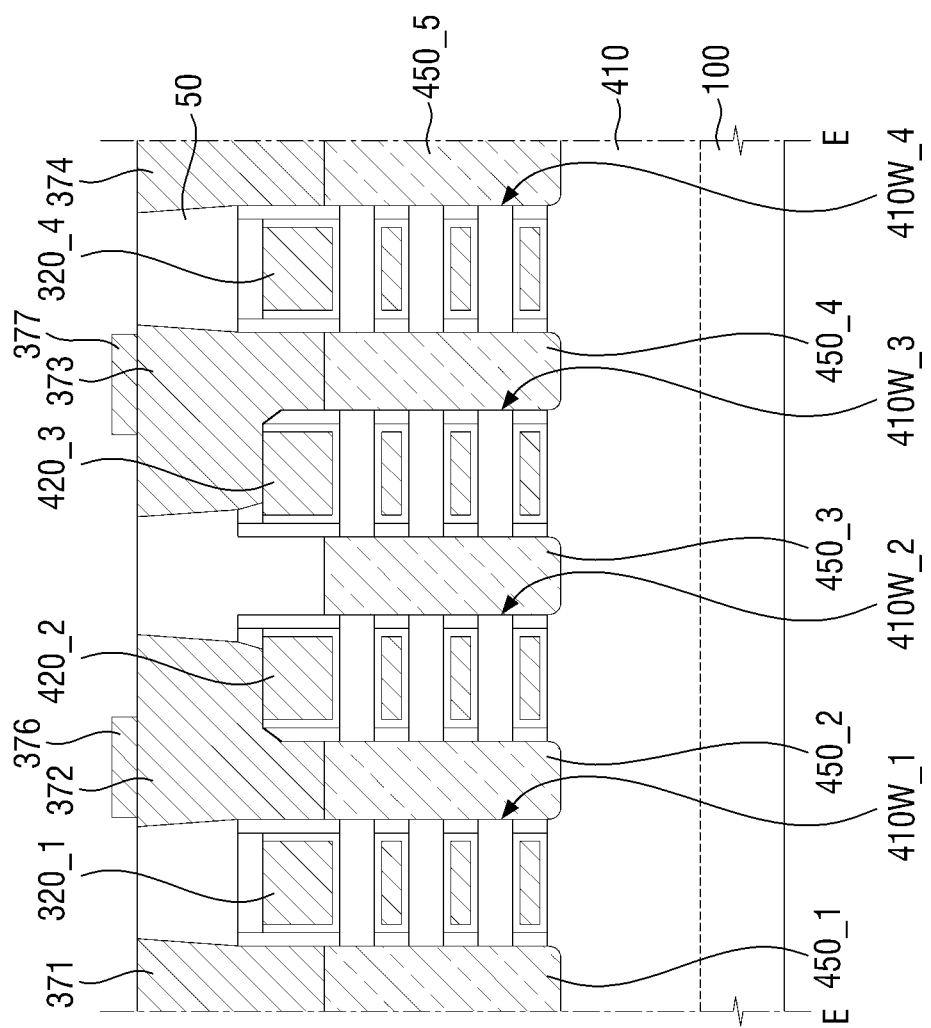
FIGS. 15 and 16 are cross-sectional views taken along lines E-E and F-F of FIG. 13.
Figure 16:
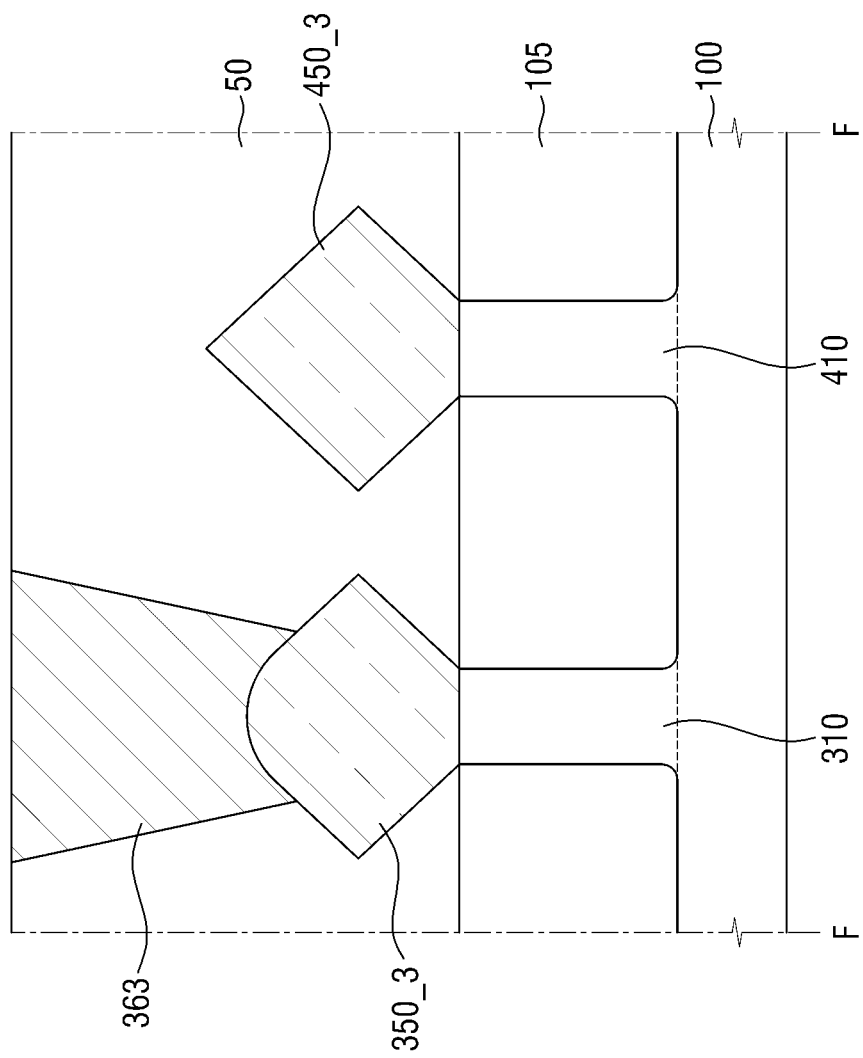
Figure 17:
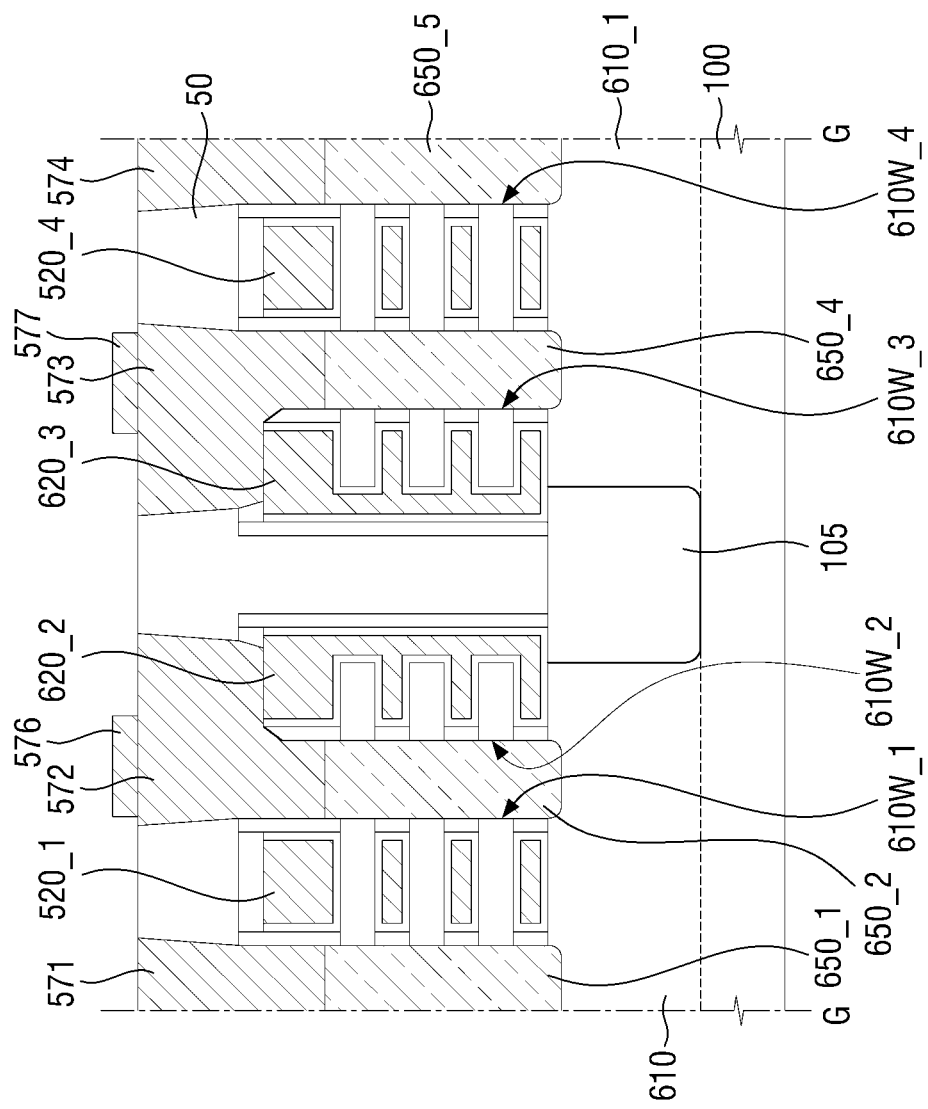
FIGS. 17 and 18 are cross-sectional views taken along lines G-G and H-H of FIG. 14.
Figure 18:
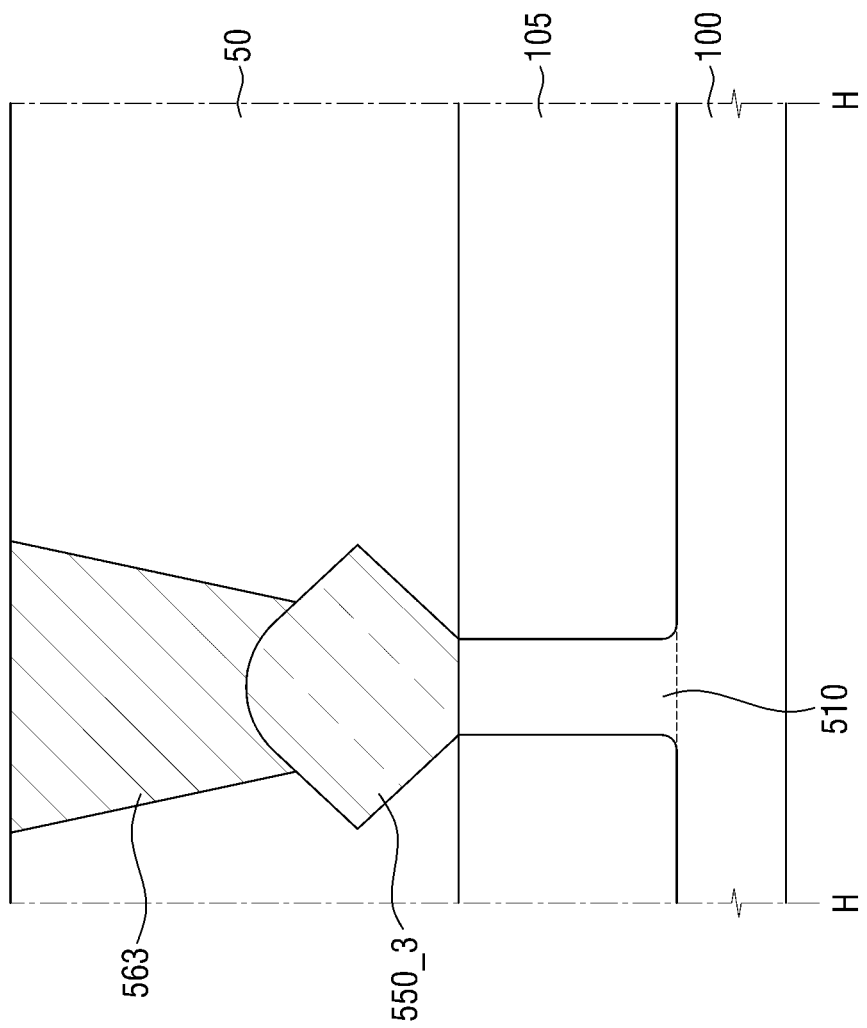

FIG. 12 is a diagram for explaining a semiconductor device according to some embodiments. FIG. 13 is a layout diagram of the first SRAM region of FIG. 12. FIG. 14 is a layout diagram of the second SRAM region of FIG. 12. FIGS. 15 and 16 are cross-sectional views taken along lines E-E and F-F of FIG. 13. FIGS. 17 and 18 are cross-sectional views taken along lines G-G and H-H of FIG. 14.

Referring to FIGS. 12 to 18, in the semiconductor device according to some embodiments, the substrate 100 may include a first SRAM region 11 and a second SRAM region 12.

A fifth fin type pattern 310, a sixth fin type pattern 410, a seventh fin type pattern 415, an eighth fin type pattern 315, a plurality of third gate patterns 320_1, 320_2, 320_3 and 320_4, and a plurality of fourth gate patterns 420_1, 420_2, 420_3 and 420_4 may be disposed in the first SRAM region 11 with a first NMOS region and a first PMOS region.

Each of the fifth fin type pattern 310, the sixth fin type pattern 410, the seventh fin type pattern 415 and the eighth fin type pattern 315 extends lengthwise in a third direction X2. The fifth fin type pattern 310, the sixth fin type pattern 410, the seventh fin type pattern 415 and the eighth fin type pattern 315 are sequentially arranged and spaced apart from each other in a fourth direction Y2 different from the third direction X2. The fifth fin type pattern 310 and the eighth fin type pattern 315 are disposed in the first NMOS region, and the sixth fin type pattern 410 and the seventh fin type pattern 415 may be disposed in the first PMOS region.

In the semiconductor device according to some embodiments, a width W21 of the fifth fin type pattern 310 in the fourth direction Y2 may be substantially the same as a width W22 of the sixth fin type pattern 410 in the fourth direction Y2.

Each of the plurality of third gate patterns 320_1, 320_2, 320_3 and 320_4 extends lengthwise in the fourth direction Y2. The third gate patterns 320_1, 320_2, 320_3 and 320_4 may be sequentially disposed in the third direction X2. The plurality of third gate patterns 320_1, 320_2, 320_3 and 320_4 may intersect the fifth fin type pattern 310. The third_1 gate pattern 320_1 and the third_4 gate pattern 320_4 may intersect the sixth fin type pattern 410 and the seventh fin type pattern 415.

Each of the plurality of fourth gate patterns 420_1, 420_2, 420_3 and 420_4 extends lengthwise in the fourth direction Y2. The fourth gate patterns 420_1, 420_2, 420_3, and 420_4 are sequentially disposed in the third direction X2. The plurality of fourth gate patterns 420_1, 420_2, 420_3, and 420_4 intersect the eighth fin type pattern 315. The fourth_2 gate pattern 420_2 and the fourth_3 gate pattern 420_3 further intersect the sixth fin type pattern 410 and the seventh fin type pattern 415.

The third gate patterns 320_1, 320_2, 320_3 and 320_4 may be spaced apart from the fourth gate patterns 420_1, 420_2, 420_3 and 420_4 in the fourth direction Y2, respectively.

As illustrated, a seventh pull-up transistor PU7 is defined around an intersection region between the fourth_2 gate pattern 420_2 and the seventh fin type pattern 415, a seventh pull-down transistor PD7 is defined around an intersection region between the fourth_2 gate pattern 420_2 and the eighth fin type pattern 315, and a seventh pass transistor PS7 is defined around an intersection region between the fourth_1 gate pattern 420_1 and the eighth fin type pattern 315.

An eighth pull-up transistor PU8 is defined around an intersection region between the third_1 gate pattern 320_1 and the sixth fin type pattern 410, an eighth pull-down transistor PD8 is defined around an intersection region between the third_1 gate pattern the 320_1 and the fifth fin type pattern 310, and an eighth pass transistor PS8 is defined around an intersection region between the third_2 gate pattern 320_2 and the fifth fin type pattern 310.

A ninth pull-up transistor PU9 is defined around an intersection region between the fourth_3 gate pattern 420_3 and the seventh fin type pattern 415, a ninth pull-down transistor PD9 is defined around an intersection region between the fourth_3 gate pattern 420_3 and the eighth fin type pattern 315, and a ninth pass transistor PS9 is defined around an intersection region between the fourth_4 gate pattern 420_4 and the eighth fin type pattern 315.

A tenth pull-up transistor PU10 is defined around an intersection region between the third_4 gate pattern 320_4 and the sixth fin type pattern 410, a tenth pull-down transistor PD10 is defined around an intersection region between the third_4 gate pattern 320_4 and the fifth fin type pattern 310, and a tenth pass transistor PS10 is defined around an intersection region between the third_3 gate pattern 320_3 and the fifth fin type pattern 310.

A plurality of third nanosheet structures 410W_1, 410W_2, 410W_3 and 410W_4 are disposed on the sixth fin type pattern 410. The plurality of third nanosheet structures 410W_1, 410W_2, 410W_3 and 410W_4 spaced apart from one another are arranged in the third direction X2 on the upper surface of the sixth fin type pattern 410. As in the plurality of third nanosheet structures 410W_1, 410W_2, 410W_3 and 410W_4, a plurality of nanosheets are also disposed on the fifth fin type pattern 310, the seventh fin type pattern 415 and the eighth fin type pattern 315.

A plurality of third semiconductor patterns 450_1, 450_2, 450_3, 450_4 and 450_5 may be disposed on the sixth fin type pattern 410. Each of the third semiconductor patterns 450_1, 450_2, 450_3, 450_4 and 450_5 may be connected to at least one of the third nanosheet structures 410W_1, 410W_2, 410W_3 and 410W_4 adjacent thereto. For example, the third semiconductor pattern 450_1 is connected to the third nanosheet structure 410W_1 adjacent to the third semiconductor pattern 450_1, and the third semiconductor pattern 450_2 is connected to two third nanosheet structures 410W_1 and 410W_2 adjacent to the third semiconductor pattern 450_2.

The wiring structure may include a plurality of contacts 361, 362, 363, 364, 365, 371, 372, 373, 374, 381, 382, 383, 384, 385, 391, 392, and 393, and connection wirings 376, 377, 396 and 397.

Some third semiconductor patterns 450_1, 450_2, 450_4 and 450_5 are connected to the contacts 371, 372, 373 and 374, respectively. However, the third_3 semiconductor pattern 450_3 is not connected to any contact of the wiring structure. That is, the third_3 semiconductor pattern 450_3 may be electrically in a floating state.

A plurality of fourth semiconductor patterns may be disposed on a fifth fin type pattern 310. The plurality of fourth semiconductor patterns may be disposed at a region of the fifth fin type pattern 310 corresponding to one of the plurality of third semiconductor patterns 450_1, 450_2, 450_3, 450_4 and 450_5. The fourth_3 semiconductor pattern 350_3 corresponding to the third_3 semiconductor pattern 450_3 may be disposed on the fifth fin type pattern 310 and connected to the contact 363 of the wiring structure. The third_3 semiconductor pattern 450_3 and the fourth_3 semiconductor pattern 350_3 are arranged in the fourth direction Y2.

The description of the plurality of contacts 361, 362, 363, 364, 365, 371, 372, 373, 374, 381, 382, 383, 384, 385, 391, 392, and 393 and the connection wirings 376, 377, 396 and 397 may be substantially the same as the description of the contact and the connection wiring described through FIGS. 2 to 4.

A ninth fin type pattern 510, a tenth fin type pattern 610, a tenth_1 fin type pattern 610_1, an eleventh fin type pattern 615, a twelfth fin type pattern 515, a plurality of fifth gate patterns 520_1, 520_2, 520_3 and 520_4, and a plurality of sixth gate patterns 620_1, 620_2, 620_3 and 620_4 may be disposed in the second SRAM region 12 with a second NMOS region and a second PMOS region.

Each of the ninth fin type pattern 510, the tenth fin type pattern 610, the tenth_1 fin type pattern 610_1, the eleventh fin type pattern 615 and the twelfth fin type patterns 515 extends lengthwise in a fifth direction X3. The ninth fin type pattern 510, the tenth fin type pattern 610, the eleventh fin type pattern 615 and the twelfth fin type patterns 515 are sequentially disposed to be spaced apart from each other in a sixth direction Y3 different from. The ninth fin type pattern 510, the tenth_1 fin type pattern 610_1, the eleventh fin type pattern 615 and the twelfth fin type patterns 515 are sequentially disposed to be spaced apart from each other in the sixth direction Y3. The tenth fin type pattern 610 and the tenth_1 fin type pattern 610_1 may be disposed between the ninth fin type pattern 510 and the eleventh fin type pattern 615. The tenth fin type pattern 610 and the tenth_1 fin type pattern 610_1 may be spaced apart from each other in the fifth direction X3 and may be arranged in the fifth direction X3. A field insulating film 105 is disposed between a short side of the tenth fin type pattern 610 and a short side of the tenth_1 fin type pattern 610_1. The tenth fin type pattern 610 and the tenth_1 fin type pattern 610_1 may be spaced apart from each other by the field insulating film 105.

The ninth fin type pattern 510 and the twelfth fin type pattern 515 are disposed in the second NMOS region, and the tenth fin type pattern 610, the tenth_1 fin type pattern 610_1, and the eleventh fin type pattern 615 may be disposed in the second PMOS region.

In the semiconductor device according to some embodiments, a width W31 of the ninth fin type pattern 510 in the sixth direction Y3 may be greater than a width W32 of the tenth fin type pattern 610 in the sixth direction Y3.

Each of the plurality of fifth gate patterns 520_1, 520_2, 520_3, and 520_4 extends lengthwise in the sixth direction Y3. The fifth gate patterns 520_1, 520_2, 520_3, and 520_4 are sequentially disposed in the fifth direction X3. The plurality of fifth gate patterns 520_1, 520_2, 520_3, and 520_4 intersect the ninth fin type pattern 510. The fifth_1 gate pattern 520_1 further intersects the tenth fin type pattern 610 and the eleventh fin type pattern 615, and the fifth_4 gate pattern 520_4 may intersect the tenth_1 fin type pattern 610_1 and the eleventh fin type pattern 615.

Each of the plurality of sixth gate patterns 620_1, 620_2, 620_3 and 620_4 extends lengthwise in the sixth direction Y3. The sixth gate patterns 620_1, 620_2, 620_3, and 620_4 are sequentially disposed in the fifth direction X3. The plurality of sixth gate patterns 620_1, 620_2, 620_3 and 620_4 intersect the twelfth fin type pattern 515. The sixth_2 gate pattern 620_2 further intersects the tenth fin type pattern 610 and the eleventh fin type pattern 615, and the sixth_3 gate pattern 620_3 further intersects the tenth_1 fin type pattern 610_1 and the eleventh fin type pattern 615.

The fifth gate patterns 520_1, 520_2, 520_3 and 520_4 are spaced apart from the sixth gate patterns 620_1, 620_2, 620_3 and 620_4 in the sixth direction Y3, respectively.

As illustrated, an eleventh pull-up transistor PU11 is defined around an intersection region between the sixth_2 gate pattern 620_2 and the eleventh fin type pattern 615, an eleventh pull-down transistor PD11 is defined around an intersection region between the sixth_2 gate pattern 620_2 and the twelfth fin type pattern 515, and an eleventh pass transistor PS11 is defined around an intersection region between the sixth_1 gate pattern 620_1 and the twelfth fin type pattern 515.

A twelfth pull-up transistor PU12 is defined around an intersection region between the fifth_1 gate pattern 520_1 and the tenth fin type pattern 610, a twelfth pull-down transistor PD12 is defined around an intersection region between the fifth_1 gate pattern 520_1 and the ninth fin type pattern 510, and a twelfth pass transistor PS12 is defined around an intersection region between the fifth_2 gate pattern 520_2 and the ninth fin type pattern 510.

A thirteenth pull-up transistor PU13 is defined around an intersection region between the sixth_3 gate pattern 620_3 and the eleventh fin type pattern 615, a thirteenth pull-down transistor PD13 is defined around an intersection region between the sixth_3 gate pattern 620_3 and the twelfth fin type pattern 515, and a thirteenth pass transistor PS13 is defined around an intersection region between the sixth_4 gate pattern 620_4 and the twelfth fin type pattern 515.

A fourteenth pull-up transistor PU14 is defined around an intersection region between the fifth_4 gate pattern 520_4 and the tenth_1 fin type pattern 610_1, a fourteenth pull-down transistor PD14 is defined around an intersection region between the fifth_4 gate pattern 520_4 and the ninth fin type pattern 510, and a fourteenth pass transistor PS14 is defined around an intersection region between the fifth_3 gate pattern 520_3 and the ninth fin type pattern 510.

A plurality of fourth nanosheets 610W_1, 610W_2, 610W_3 and 610W_4 are disposed on the tenth fin type pattern 610 and the tenth_1 fin type pattern 610_1. The plurality of fourth nanosheets 610W_1 and 610W_2 spaced apart from each other are arranged in the fifth direction X3 on the upper surface of the tenth fin type pattern 610. A plurality of fourth nanosheets 610W_3 and 610W_4 spaced apart from each other are arranged in the fifth direction X3 on the upper surface of the tenth_1 fin type pattern 610_1. As in the plurality of fourth nanosheets 610W_1, 610W_2, 610W_3 and 610W_4, a plurality of nanosheets may be also disposed on the ninth fin type pattern 510, the eleventh fin type pattern 615 and the twelfth fin type pattern 515.

The plurality of fifth semiconductor patterns 650_1 and 650_2 are disposed on the tenth fin type pattern 610. The plurality of fifth semiconductor patterns 650_4 and 650_5 are disposed on the tenth_1 fin type pattern 410. Each of the fifth semiconductor patterns 650_1, 650_2, 650_4 and 650_5 may be connected to at least one of the fourth nanosheets 610W_1, 610W_2, 610W_3 and 610W_4 adjacent thereto.

The wiring structure may include a plurality of contacts 561, 562, 563, 564, 565, 571, 572, 573, 574, 581, 582, 583, 584, 585, 591, 592 and 593, and the connection wirings 576, 577, 596 and 597.

Each of the fifth semiconductor patterns 650_1, 650_2, 650_4 and 650_5 is connected to the contacts 571, 572, 573 and 574. That is, all the fifth semiconductor patterns 650_1, 650_2, 650_4 and 650_5 formed on the tenth fin type pattern 610 and the tenth_1 fin type pattern 610_1 are connected to the contacts 571, 572, 573 and 574, and may be connected to the wiring structure. A semiconductor pattern of the floating state is not disposed on the tenth fin type pattern 610 and the tenth_1 fin type pattern 610_1.

The sixth semiconductor pattern may be disposed on a ninth fin type pattern 510 corresponding to the plurality of fifth semiconductor patterns 650_1, 650_2, 650_4 and 650_5. In addition, a sixth_3 semiconductor pattern 550_3 is disposed on the ninth fin type pattern 510 corresponding to the field insulating film 105 between the short side of the tenth fin type pattern 610 and the short side of the tenth_1 fin type pattern 610_1. The sixth_3 semiconductor pattern 550_3 may be connected to the contact 563 and may be connected to the wiring structure.

When describing in another way, an extension line passing through the sixth_3 semiconductor pattern 550_3 and extending in the sixth direction Y3 may pass between the short side of the tenth fin type pattern 610 and the short side of the tenth_1 fin type pattern 610_1. The field insulating film 105 between the short side of the tenth fin type pattern 610 and the short side of the tenth_1 fin type pattern 610_1 may be arranged with the sixth_3 semiconductor pattern 550_3 in the sixth direction Y3.

Description of the plurality of contacts 561, 562, 563, 564, 565, 571, 572, 573, 574, 581, 582, 583, 584, 585, 591, 592 and 593, and the connection wirings 576, 577, 596 and 597 may be substantially the same as the description of the contact and the connection described through FIGS. 2 to 4.

Figure 19:
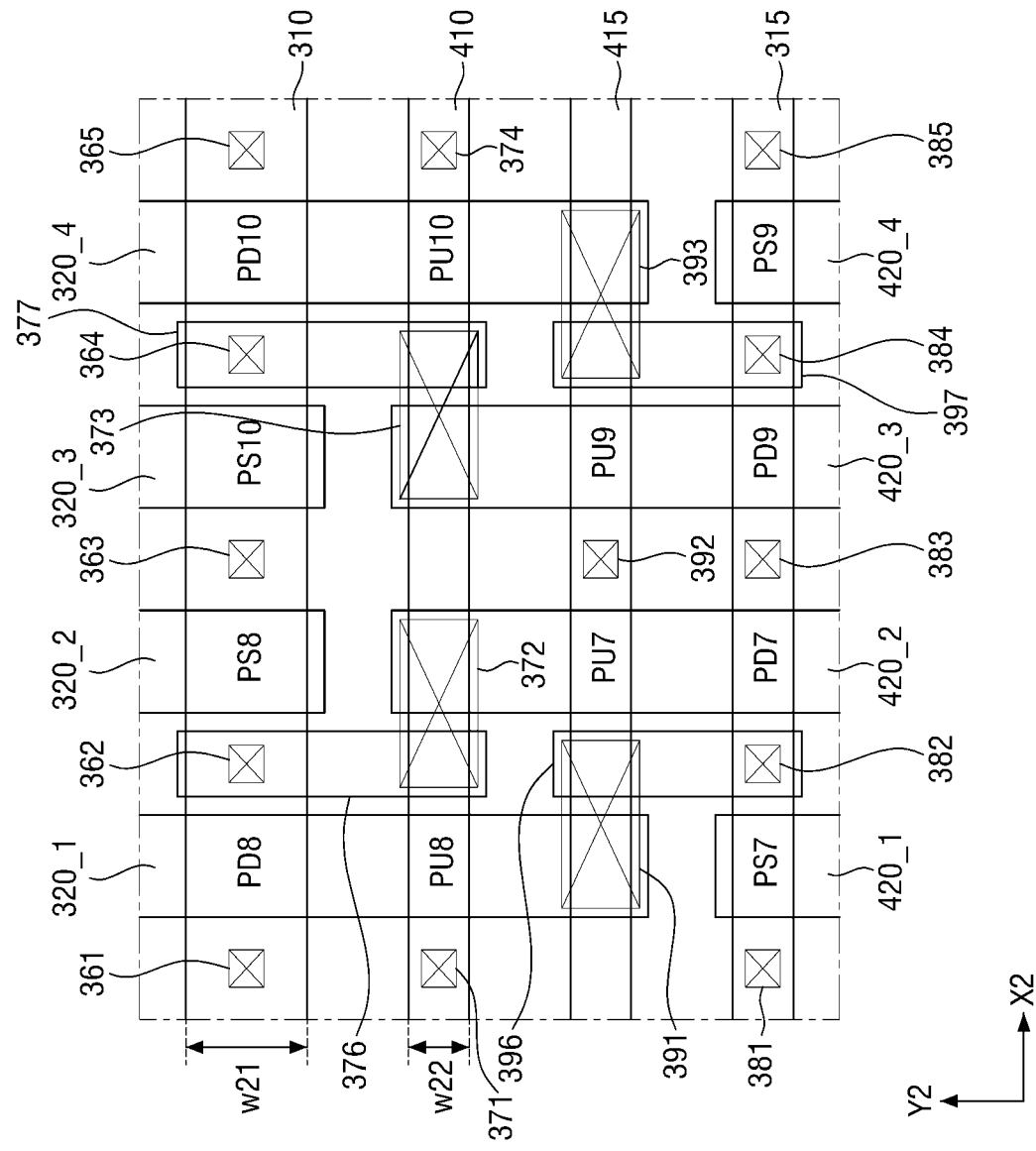
FIGS. 19 and 20 are diagrams for explaining the semiconductor device according to some embodiments.
Figure 20:
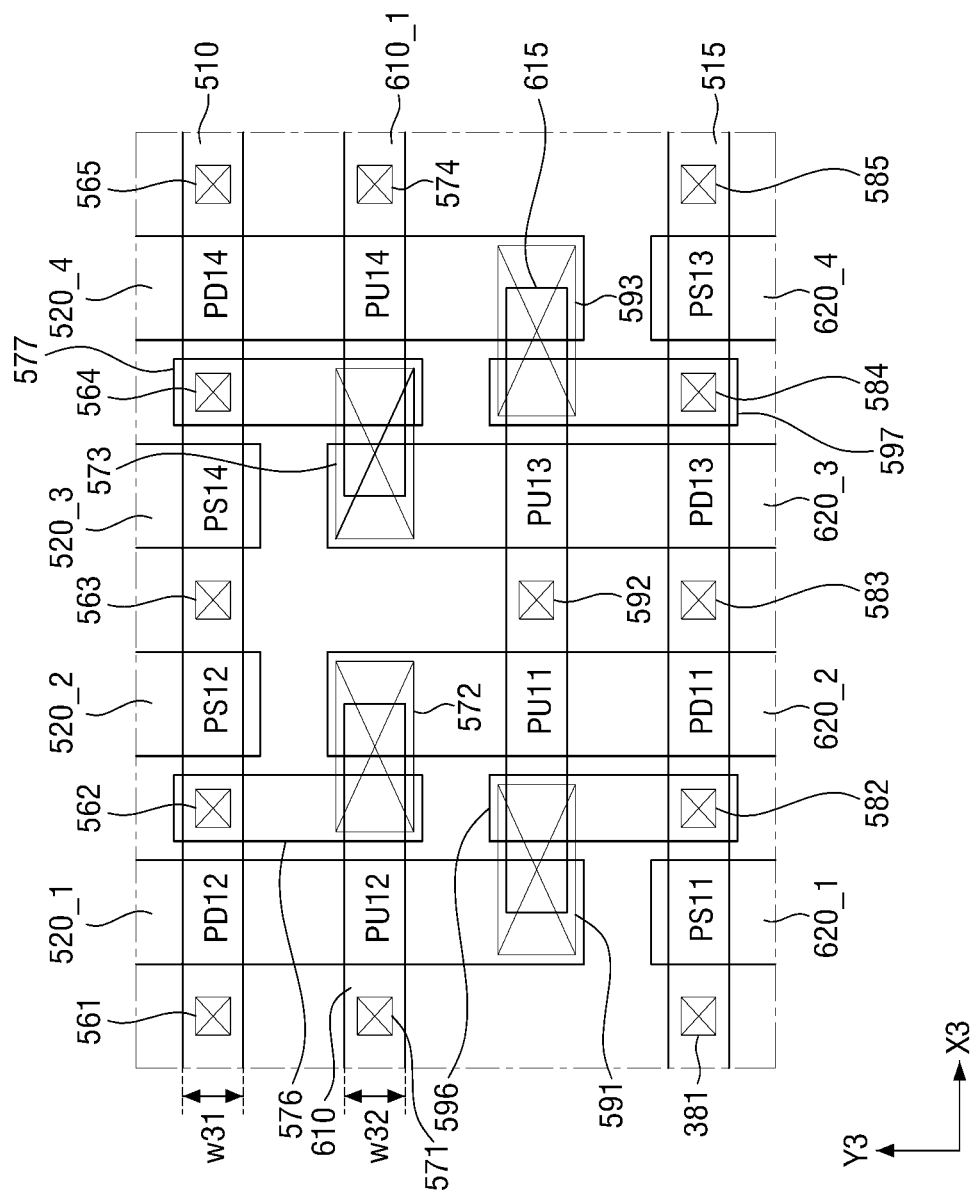

FIGS. 19 and 20 are diagrams for explaining the semiconductor device according to some embodiments. For convenience of explanation, differences from those described using FIGS. 13 to 18 will be mainly described.

Referring to FIGS. 19 and 20, in the semiconductor device according to some embodiments, a width W21 of the fifth fin type pattern 310 in the fourth direction Y2 may be greater than a width W22 of the sixth fin type pattern 410 in the fourth direction Y2.

Further, a width W31 of the ninth fin type pattern 510 in the sixth direction Y3 may be substantially the same as a width W32 of the tenth fin type pattern 610 in the sixth direction Y3.

Figure 21:
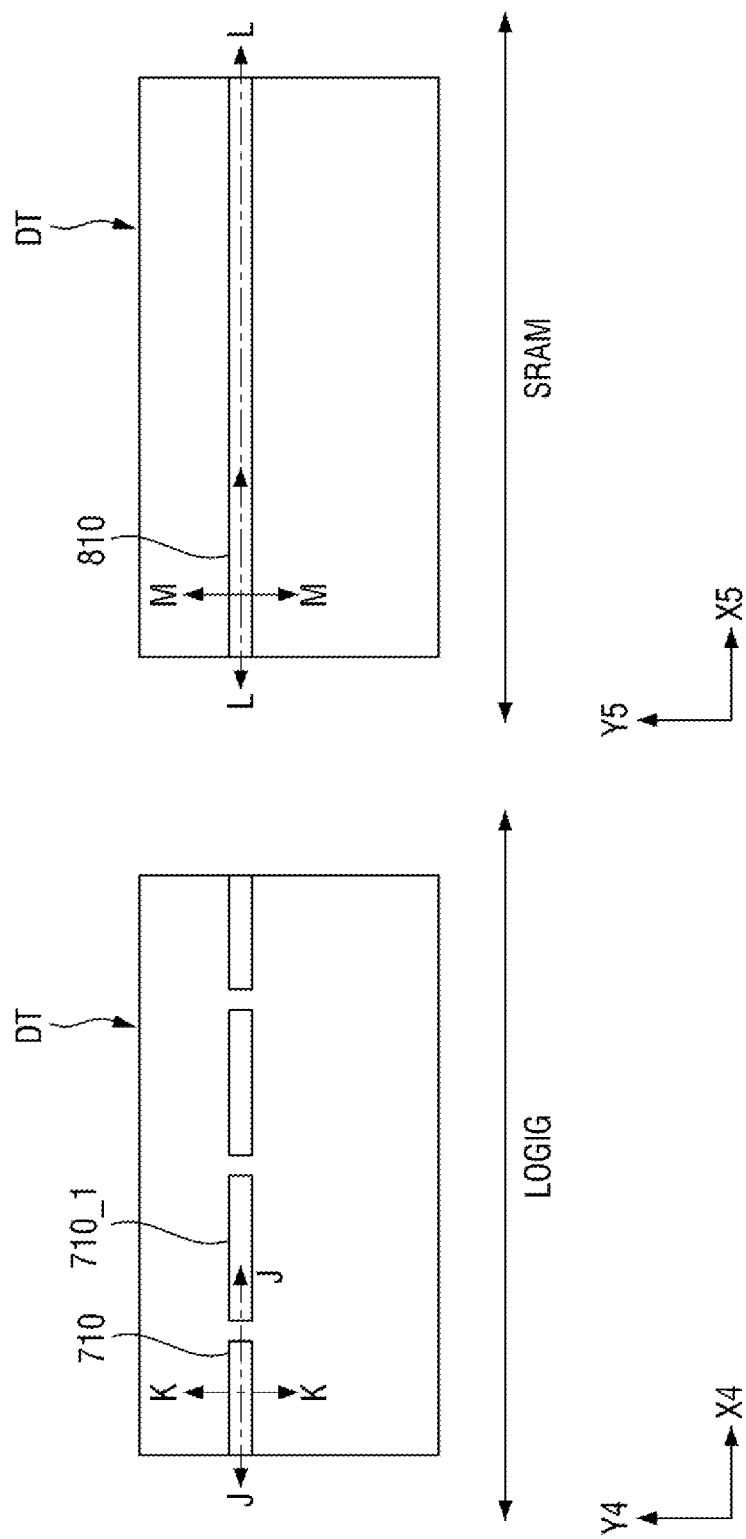
FIG. 21 is a diagram for explaining the semiconductor device according to some embodiments.
Figure 22:
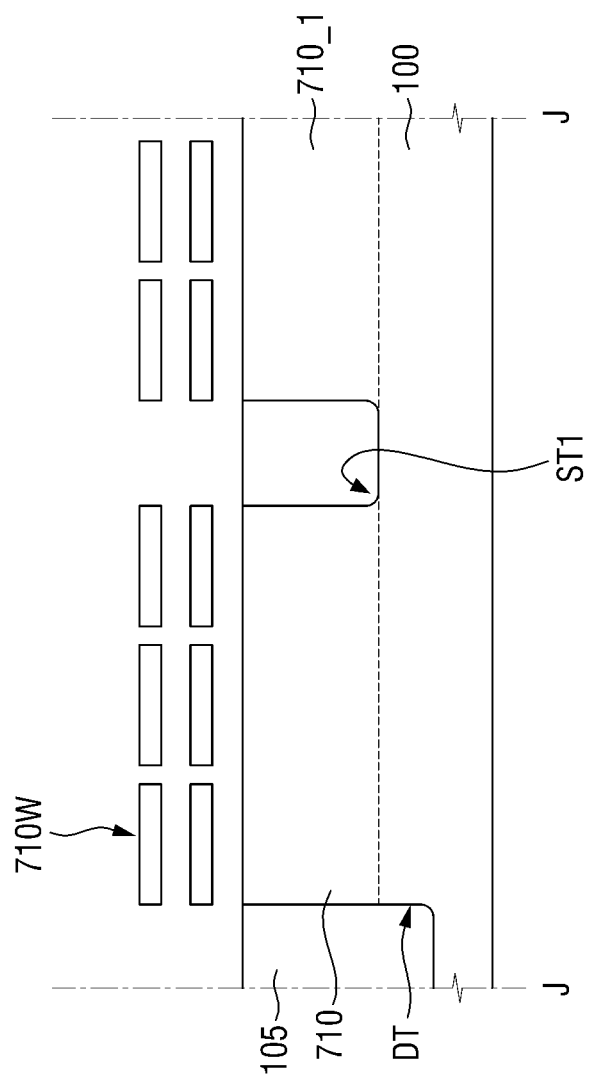
FIGS. 22 and 23 are cross-sectional views taken along lines J-J and K-K of FIG. 21.
Figure 23:
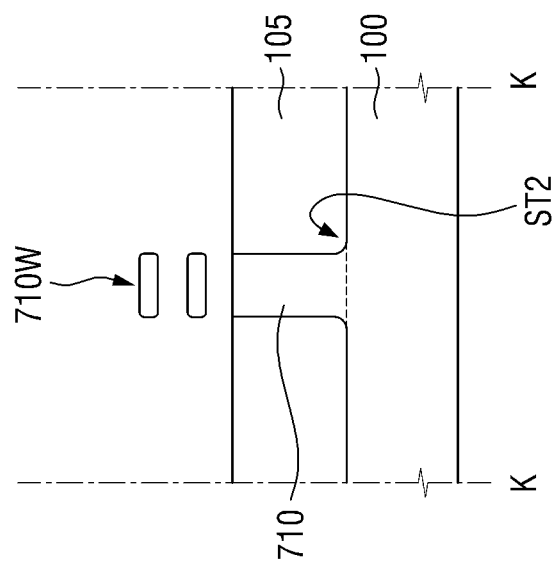
Figure 24:
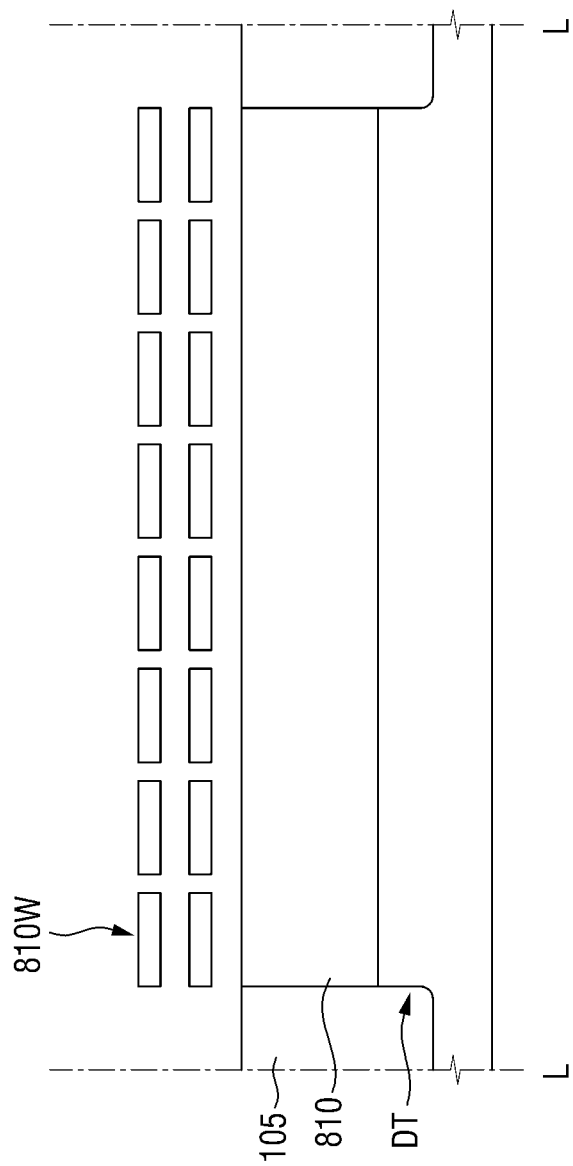
FIGS. 24 and 25 are cross-sectional views taken along lines L-L and M-M of FIG. 21.
Figure 25:
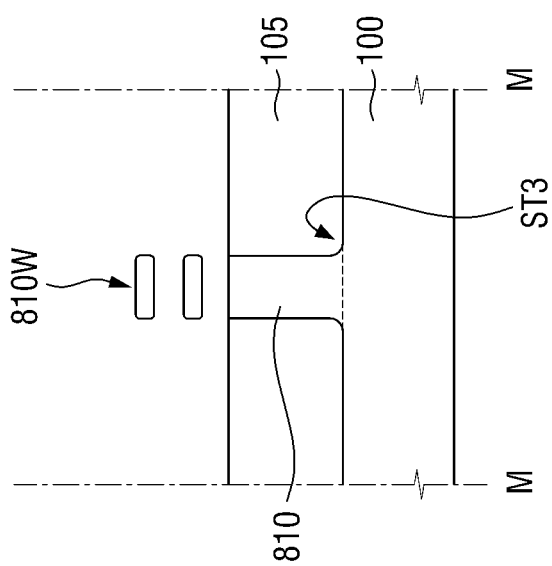

FIG. 21 is a diagram for explaining a semiconductor device according to some embodiments. FIGS. 22 and 23 are cross-sectional views taken along lines J-J and K-K of FIG. 21. FIGS. 24 and 25 are cross-sectional views taken along lines L-L and M-M of FIG. 21. For reference, FIG. 21 does not show nanosheets.

Referring to FIGS. 21 to 25, the semiconductor device according to some embodiments may have a thirteenth fin type pattern 710, a thirteenth_1 fin type pattern 710_1, and a fourteenth fin type pattern 810.

The substrate 100 may include a logic region LOGIC and an SRAM region SRAM. The logic region LOGIC and the SRAM region SRAM may each be defined by a deep trench DT.

The thirteenth fin type pattern 710 and the thirteenth_1 fin type pattern 710_1 are disposed in the logic region LOGIC of the substrate 100. The thirteenth fin type pattern 710 and the thirteenth_1 fin type pattern 710_1 are disposed in a PMOS region of the logic region LOGIC.

The fourteenth fin type pattern 810 is disposed in the SRAM region SRAM of the substrate 100. The fourteenth fin type pattern 810 is disposed in a PMOS region of the SRAM region SRAM.

The thirteenth fin type pattern 710 and the thirteenth_1 fin type pattern 710_1 each have a long side extending in a seventh direction X4 and a short side extending in an eighth direction Y4 different from the seventh direction X4.

One of the short sides of the thirteenth fin type pattern 710 may be defined by the deep trench DT which defines the logic region LOGIC. A first shallow trench ST1 shallower than the deep trench DT may be formed between the thirteenth fin type pattern 710 and the thirteenth_1 fin type pattern 710_1. The thirteenth fin type pattern 710 and the thirteenth_1 fin type pattern 710_1 may be separated by the first shallow trench ST1. Another one of the short sides of the thirteenth fin type pattern 710 and one of the short sides of the thirteenth_1 fin type pattern 710_1 may be defined by the first shallow trench ST1.

A long side of the thirteenth fin type pattern 710 and a long side of the thirteenth_1 fin type pattern 710_1 may be defined by a second shallow trench ST2 shallower than the deep trench DT.

A plurality of fifth nanosheets 710W_spaced apart from each other in a seventh direction X4 may be disposed on the thirteenth fin type pattern 710 and the thirteenth_1 fin type pattern 710_1. The plurality of fifth nanosheets 710W_may be arranged in the seventh direction X4.

The fourteenth fin type pattern 810 may include a long side extending in a ninth direction X5 and a short side extending in a tenth direction Y5. The fourteenth fin type pattern 810 is not separated in the SRAM region SRAM. When describing in another way, all the short sides of the fourteenth fin type pattern 810 may be defined by the deep trench DT defining the SRAM region SRAM.

A long side of the fourteenth fin type pattern 810 may be defined by a third shallow trench ST3 shallower than the deep trench DT.

A plurality of sixth nanosheets 810W_spaced apart from each other in the ninth direction X5 may be disposed on the fourteenth fin type pattern 810. The plurality of sixth nanosheets 810W_may be arranged in the ninth direction X5.

The field insulating film 105 may fill the deep trench DT, the first shallow trench ST1, the second shallow trench ST2, and the third shallow trench ST3.

Although not illustrated, a gate pattern which wraps around each fifth nanosheet 710W and each sixth nanosheet 810W_may be formed on the substrate 100.

In concluding the detailed description, those skilled in the art will appreciate that many variations and modifications may be made to the embodiments without substantially departing from the principles of the present inventive concept. Therefore, the disclosed preferred embodiments of the inventive concept are used in a generic and descriptive sense only and not for purposes of limitation.

What is claimed is:
1. A semiconductor device comprising:
a first fin type pattern extending lengthwise in a first direction;

a second fin type pattern extending lengthwise in the first direction and spaced apart from the first fin type pattern in a second direction different from the first direction;
a first gate pattern and a second gate pattern intersecting the first fin type pattern and the second fin type pattern;
a third gate pattern and a fourth gate pattern intersecting the first fin type pattern between the first gate pattern and the second gate pattern;
a fifth gate pattern intersecting the second fin type pattern and spaced apart from the third gate pattern in the second direction;
a sixth gate pattern intersecting the second fin type pattern and spaced apart from the fourth gate pattern in the second direction;
first to third semiconductor patterns sequentially disposed on the first fin type pattern and disposed between the first gate pattern and the third gate pattern, between the third gate pattern and the fourth gate pattern, and between the fourth gate pattern and the second gate pattern respectively; and
fourth to sixth semiconductor patterns sequentially disposed on the second fin type pattern and disposed between the first gate pattern and the fifth gate pattern, between the fifth gate pattern and the sixth gate pattern, and between the sixth gate pattern and the second gate pattern respectively,
wherein the first semiconductor pattern to the fourth semiconductor pattern and the sixth semiconductor pattern are electrically connected to a wiring structure, and
the fifth semiconductor pattern is not connected to the wiring structure.

2. The semiconductor device of claim 1,
wherein the first semiconductor pattern and the fourth semiconductor pattern are spaced apart from each other in the second direction and electrically connected to each other, and the third semiconductor pattern and the sixth semiconductor pattern are spaced apart from each other in the second direction and electrically connected to each other.

3. The semiconductor device of claim 2,
wherein the fourth semiconductor pattern is electrically connected to the third gate pattern, and the sixth semiconductor pattern is electrically connected to the fourth gate pattern.

4. The semiconductor device of claim 1,
wherein each of the first to sixth gate patterns wraps around at least one or more nanosheets disposed the first fin type pattern, and the second fin type pattern.

5. The semiconductor device of claim 1,
wherein the first fin type pattern and the second fin type pattern are formed in a static random access memory (SRAM) region.

6. The semiconductor device of claim 1, further comprising:
one or more first nanosheets disposed on the first fin type pattern, and one or more second nanosheets disposed on the second fin type pattern,
wherein the one or more first nanosheets are used as a channel region of an NMOS, and the one or more second nanosheets are used as a channel region of a PMOS.

7. The semiconductor device of claim 6,
wherein a width of each of the one or more first nanosheets in the second direction is substantially the same as a width of each of the second nanosheets in the second direction.

8. The semiconductor device of claim 6,
wherein a width of each of the one or more first nanosheets in the second direction is greater than a width of each of the one or more second nanosheets in the second direction.

9. A semiconductor device comprising:
a first fin type pattern which extends lengthwise in a first direction and has a first width in a second direction different from the first direction, in a first SRAM region;
a second fin type pattern which extends lengthwise in the first direction and is spaced apart from the first fin type pattern in the second direction, in the first SRAM region;
first to fourth gate patterns which intersect the first fin type pattern and are disposed sequentially in the first direction, each of the first gate pattern and the fourth gate pattern further intersecting the second fin type pattern;
a first semiconductor pattern disposed on the first fin type pattern and between the second gate pattern and the third gate pattern;
a second semiconductor pattern disposed on the second fin type pattern corresponding to the first semiconductor pattern, the second semiconductor pattern and the first semiconductor pattern being spaced apart from each other in the second direction;
a third fin type pattern which extends lengthwise in a third direction and has a second width in a fourth direction different from the third direction, in a second SRAM region;
fourth and fifth fin type patterns which extend lengthwise in the third direction in the second SRAM region and are spaced apart from the third fin type pattern in the fourth direction, the fourth and fifth fin type patterns being arranged in the third direction;
fifth to eighth gate patterns which intersect the third fin type pattern and are sequentially arranged in the third direction, the fifth gate pattern further intersecting the fourth fin type pattern, and the eighth gate pattern further intersecting the fifth fin type pattern;
a third semiconductor pattern disposed on the third fin type pattern and between the sixth gate pattern and the seventh gate pattern; and
a field insulating film disposed between a short side of the fourth fin type pattern and a short side of the fifth fin type pattern,
wherein an extension line passing through the third semiconductor pattern and extending in the fourth direction passes between the fourth fin type pattern and the fifth fin type pattern.

10. The semiconductor device of claim 9,
wherein a first width of the first fin type pattern is greater than a second width of the third fin type pattern.

11. The semiconductor device of claim 9,
wherein a first width of the first fin type pattern is smaller than a second width of the third fin type pattern.

12. The semiconductor device of claim 9,
wherein the first semiconductor pattern and the third semiconductor pattern are connected to one of a bit line and a complementary bit line.

13. The semiconductor device of claim 9,
wherein the second semiconductor pattern is configured to be electrically floating.

14. The semiconductor device of claim 13,
wherein a contact connected to the second semiconductor pattern is not disposed on the second semiconductor pattern.

15. A semiconductor device comprising:
a first fin type pattern disposed in an SRAM region;
a plurality of semiconductor patterns disposed on the first fin type pattern to be spaced apart from each other in a first direction, and divided into a first group and a second group;
a plurality of nanosheet structures, each having at least one or more nanosheets and being disposed between corresponding two adjacent semiconductor patterns of the plurality of semiconductor patterns; and
a plurality of gate patterns, each being disposed on a corresponding one of the plurality of nanosheet structures,
wherein the semiconductor patterns of the first group are electrically connected to a plurality of wiring structures,
wherein the semiconductor patterns of the second group are configured to be electrically floating, and
wherein the plurality of wiring structures include a first wiring structure which is connected to a corresponding semiconductor pattern of the plurality of semiconductor patterns of the first group and a corresponding gate pattern of the plurality of gate patterns, and vertically overlaps the corresponding gate pattern.

16. The semiconductor device of claim 15,
wherein the at least one or more nanosheets are used as a channel region of a PMOS transistor in a PMOS region of the SRAM region.

17. The semiconductor device of claim 15,
wherein the plurality of semiconductor patterns are regularly arranged.

18. The semiconductor device of claim 17,
wherein a number of the first group of the semiconductor patterns is greater than a number of the second group of the semiconductor patterns.

19. The semiconductor device of claim 15,
wherein the plurality of wiring structures includes a plurality of contacts each of which being connected to a corresponding one of the semiconductor patterns of the first group.

20. The semiconductor device of claim 19,
wherein the plurality of contacts are not disposed on the semiconductor patterns of the second group.

\* \* \* \* \*